(12) United States Patent
de Vreede et al.

(10) Patent No.: US 10,644,656 B2
(45) Date of Patent: May 5, 2020

(54) RF-DAC BASED PHASE MODULATOR

(71) Applicant: Technische Universiteit Delft, Delft (NL)

(72) Inventors: Leonardus Cornelius Nicolaas de Vreede, Delft (NL); Seyed Morteza Alavi, Delft (NL); Mohammedreza Mehrpoo, Delft (NL); Mikhail Evgenyevich Polushkin, Delft (NL); Mohsen Hashemi, Delft (NL); Yiyu Shen, Delft (NL)

(73) Assignee: Technische Universiteit Delft, Delft (NL)

( * ) Notice: Subject to any disclaimer, the term of this patent is extended or adjusted under 35 U.S.C. 154(b) by 145 days.

(21) Appl. No.: 15/860,848

(22) Filed: Jan. 3, 2018

(65) Prior Publication Data

US 2019/0207565 A1 Jul. 4, 2019

(51) Int. Cl.
*H03F 1/32* (2006.01)
*H03F 1/02* (2006.01)
*H04L 27/36* (2006.01)
*H04B 1/04* (2006.01)
*H03F 3/24* (2006.01)

(52) U.S. Cl.
CPC ......... *H03F 1/3241* (2013.01); *H03F 1/0222* (2013.01); *H03F 1/0227* (2013.01); *H03F 1/0288* (2013.01); *H03F 1/3223* (2013.01); *H03F 3/24* (2013.01); *H04B 1/0483* (2013.01); *H04L 27/362* (2013.01); *H03F 2200/451* (2013.01)

(58) Field of Classification Search
CPC combination set(s) only.
See application file for complete search history.

(56) References Cited

U.S. PATENT DOCUMENTS 7,010,280 B1 * 3/2006 Wilson ................ H04L 27/2046
330/10
2007/0263748 A1 * 11/2007 Mesecher .............. H01Q 1/282
375/299

OTHER PUBLICATIONS

Y. Shen et al., "A fully-integrated digital-intensive polar Doherty transmitter," Radio Frequency Integrated Circuits Symposium (RFIC), Jun. 4-6, 2017.

(Continued)

*Primary Examiner* — Junpeng Chen
(74) *Attorney, Agent, or Firm* — Patent Law Professionals, P.C.; William E. Winters

(57) ABSTRACT

A wideband, frequency agile, radio frequency digital-to-analog converter (RF-DAC) based phase modulator includes first, second, and third RF-DACs, each configured to upconvert an input I/Q digital baseband signal pair to a local oscillator (LO) frequency but with the first RF-DAC being driven by a first set of LO clocks, the second RF-DAC being driven by a second set of LO clocks that is forty-five degrees out of phase with respect to the first set of LO clocks, and the third RF-DAC being driven by a third set of LO clocks that is a further forty-five degrees out of phase with respect to the second set of LO clocks. First, second, and third upconverted analog signals produced by the first, second, and third RF-DACs are combined to reinforce the fundamental LO component while canceling $3^{rd}$-order and $5^{th}$-order LO harmonics.

23 Claims, 15 Drawing Sheets

(56) References Cited

OTHER PUBLICATIONS

M. Mehrpoo et al., "A wideband linear direct digital RF modulator using harmonic rejection and I/Q-interleaving RF DACs," Radio Frequency Integrated Circuits Symposium (RFIC), Jun. 4-6, 2017.
L. Ye et al., "Design Considerations for a Direct Digitally Modulated WLAN Transmitter With Integrated Phase Path and Dynamic Impedance Modulation," IEEE Journal of Solid-State Circuits, vo.. 48, No. 12, Dec. 2013.

\* cited by examiner

RF-DAC BASED PHASE MODULATOR

BACKGROUND OF THE INVENTION

Radio frequency (RF) transmitters are used in basestations, cellular handsets, smartphones, tablets, laptops, etc. to transmit voice and/or data to RF receivers. In general, as illustrated in FIG. 1 an RF transmitter 100 is comprised of three primary components: a modulator 102, a power amplifier (PA) 104, and an antenna 106. The modulator 102 serves to modulate the voice or data to be transmitted onto an RF carrier having a frequency capable of 'carrying' the voice or data over the air to a remote receiver, such as a cellular base station, Wi-Fi hotspot, or Bluetooth receiver, as the case may be, and the PA 104 operates to increase the RF power of the modulated RF carrier, just prior to being radiated by the antenna 106, in order to compensate for attenuation the RF carrier experiences as it propagates to the receiver.

In the interest of maximizing spectral efficiency, i.e., the data rate per given allocation of the radio frequency RF spectrum, many modern communications systems employ what are referred to as "non-constant envelope" modulation schemes, in which the modulator 102 modulates both the amplitude and angle (phase or frequency) of the RF carrier, in order to convey information. So that the PA 104 does not clip the signal peaks of the amplitude-modulated RF carrier as it translates the RF carrier to higher power, the PA's 104's output RF power must be backed off. The amount of back off required depends on the particular modulation scheme being used or, more specifically, on the peak-to-average power ratio (PAPR) of the modulated RF carrier resulting from application of the particular modulation scheme. Unfortunately, application of many modern non-constant envelope modulation schemes produce an RF carrier with a high PAPR, even greater than 6 dB, so the need to back off the PA's output power can be significant and the efficiency of the PA and efficiency of the RF transmitter as a whole both suffer dramatically as a consequence.

One way to avoid having to back off the output power of a PA in situations where a non-constant envelope modulation scheme is being used is to employ what is known as a "polar modulator." In a polar modulator, the information to be transmitted, is first converted from rectangular or Cartesian (in-phase (I), quadrature (Q)) coordinates to polar coordinates $\rho=(I^2+Q^2)^{1/2}$, $\phi=\tan^{-1}(Q/I)$ and modulation is then performed in the polar domain, i.e., instead of using rectangular (Cartesian) coordinates. FIG. 2 is a drawing showing the salient elements of a "digitally-intensive" polar modulator 200, which due to its near all-digital construction can be fully implemented in a single integrated circuit (IC) chip. The digitally-intensive polar modulator 200 comprises a digital signal processor (DSP) 202, a phase modulator 204, an amplitude control word (ACW) generator 206, and a digital PA (DPA) 208. The DSP 202 serves to convert input rectangular-coordinate I and Q digital data into digital polar-coordinate amplitude modulation (AM) and phase modulation (PM) signals. The phase modulator 204 modulates the RF carrier in accordance with the PM signal, to produce a constant-envelope phase-modulated RF carrier, which is then applied to the RF input of the DPA 208. Meanwhile, the AM signal is directed to the ACW generator 206, which responds by producing an ACW signal. The DPA 208 comprises a plurality of switch-mode PAs, typically Class D, E, or F switch-mode PAs, that can be connected in parallel and which are activated or deactivated depending on the ACW signal. Amplitude modulation of the phase-modulated RF carrier is therefore effected by simply activating or deactivating the switch-mode PAs in the DPA 208 according to the ACW signal. This capability combined with the fact that phase-modulated RF carrier applied to the RF input port of the DPA 208 has a constant envelope avoid having to back off the output RF power in order to prevent signal peak clipping. In non-polar architectures that employ non-switch-mode PAs or so-called "linear" PAs, such as Class A, B, and AB PAs, amplitude modulation can only be performed by passing the AM through the RF input port of the PA so, unfortunately, there is no other recourse but to back off the linear PA's output power.

Other efficiency enhancing approaches, like the more recently introduced digital polar Doherty and digital outphasing PA architectures, also exploit the high efficiency capabilities of switch-mode PAs. However, because switch-mode PAs are highly nonlinear devices, in all of these approaches some form of PA linearization is required. Often, digital predistortion (DPD) is used to counter the switch-mode PA's nonlinearities. Regardless of the PA linearization approach that is used, however, the linearity of the PA and the linearity of the RF transmitter as a whole are both significantly impacted by the RF transmitter's phase modulator. As the phase modulator upconverts the information to be transmitted to RF, it produces local oscillator (LO) harmonics at multiples of the RF carrier frequency (LO frequency). The harmonics manifest as distortion in the output RF spectrum of the PA and tend to interfere with adjacent channels, making it difficult to comply with noise limitation requirements imposed by communications standards. The $3^{rd}$-order harmonic is particularly problematic since it is closest to the fundamental (desired) LO frequency and because it can intermodulate with the fundamental component when passing through the PA. The resulting third-order counter-intermodulation distortion (C-IMD3) can undesirably fall very near and sometimes even within the intended transmission band. Typically, a band-pass filter (BPF) 210 is used to filter out the harmonic distortion and the C-IMD3. However, BPFs are not always effective, constrain the frequency agility of the RF transmitter, are bulky, and include inductors, which are particularly undesirable in fully integrated implementations since they require large IC areas.

In addition to being the source of undesirable harmonic distortion, conventional phase modulators are often inaccurate, have a limited modulation bandwidth, and/or are capable of operating only over a very narrow range of frequencies, i.e., lack frequency agility themselves, regardless of whether a BPF is present.

Considering the drawbacks and limitations of conventional phase modulators, it would therefore be desirable to have a phase modulator for a polar modulator that: 1) is digitally implemented; 2) has a wide modulation bandwidth; 3) is frequency agile; and 4) is capable by itself of preventing LO harmonics from being produced at its output, particularly $3^{rd}$-order and $5^{th}$-order harmonics.

BRIEF SUMMARY OF THE INVENTION

A wideband, frequency agile, radio frequency digital-to-analog converter (RF-DAC) based phase modulator is disclosed. One exemplary embodiment of the wideband, frequency agile RF-DAC based phase modulator includes first, second, and third RF-DACs, each configured to upconvert an input I/Q digital baseband signal pair to a local oscillator (LO) frequency but with the first RF-DAC being driven by a first set of LO clocks, the second RF-DAC being driven by a second set of LO clocks that is forty-five degrees out of phase with respect to the first set of LO clocks, and the third RF-DAC being driven by a third set of LO clocks that is a further forty-five degrees out of phase with respect to the second set of LO clocks. First, second, and third upconverted analog signals produced by the first, second, and third RF-DACs are combined to reinforce the fundamental LO component while canceling $3^{rd}$-order and $5^{th}$-order LO harmonics. This harmonic rejection capability of the RF-DAC based phase modulator significantly relaxes the output filter requirements of any RF transmitter within which the RF-DAC based phase modulator may be used.

The RF-DAC based phase modulator of the present invention has a number of significant performance advantages over prior art phase modulators. First, its harmonic rejection property in combination with its output RC LPF obviates the need for a large and bulky BPF. Second, because the RF-DAC based phase modulator avoids using analog mixing circuits and is a near all-digital design, it can be easily integrated, along with an associated digital power amplifier (DPA), in a single, compact, integrated circuit chip. Third, the RF-DAC based phase modulator has a wide video bandwidth and is frequency agile, which affords it the ability to serve in numerous communications systems that operate in the low-GHz range. Finally, because of its low phase error, wide modulation bandwidth, and frequency agility, the RF-DAC based phase modulator is particularly well suited for polar modulators and RF transmitters that are required to operate in accordance with advanced communications standards, such as WiFi, WiMAX, and LTE, for example.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 1:
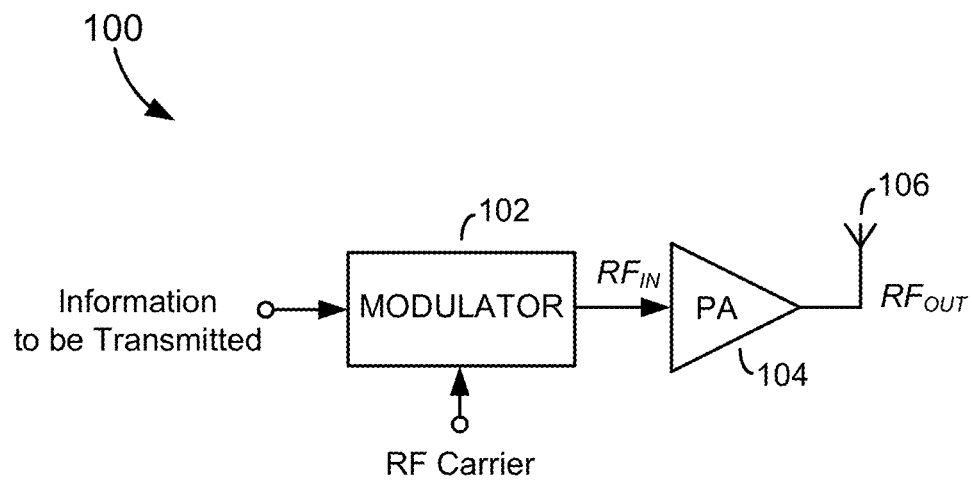
FIG. 1 is a simplified drawing of a typical radio frequency (RF) transmitter.
Figure 2:
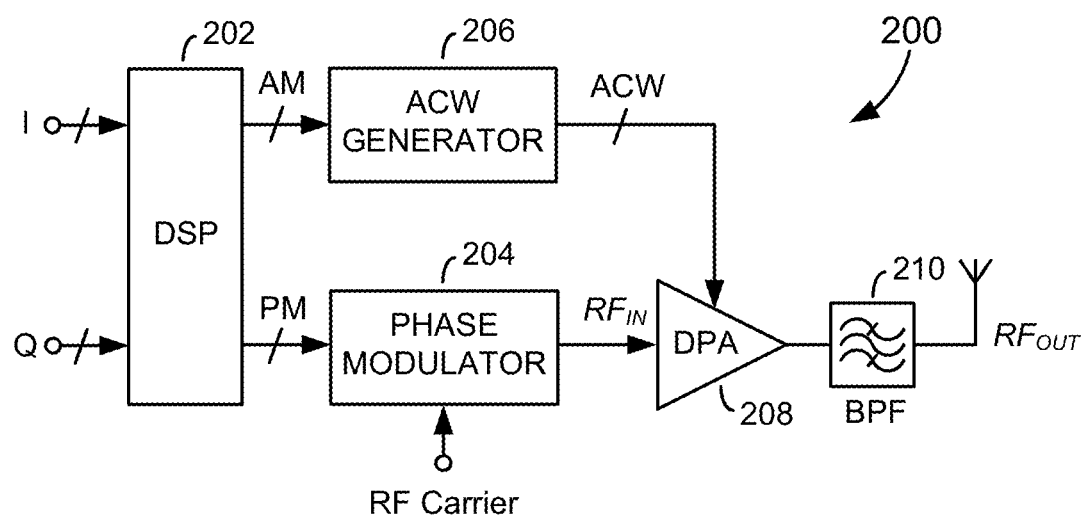
FIG. 2 is a drawing highlighting the salient elements of a "digitally-intensive" polar modulator.
Figure 3:
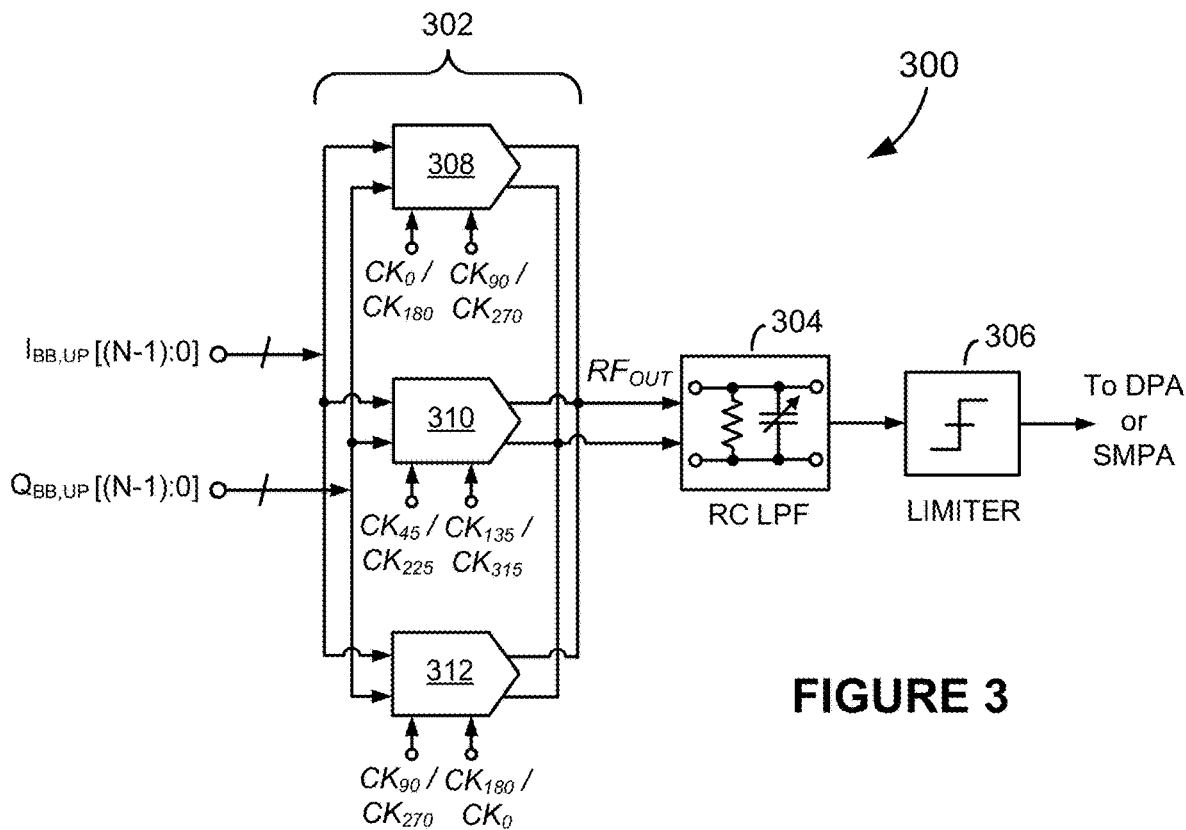
FIG. 3 is a drawing depicting an RF, digital-to-analog converter based phase modulator (RF-DAC based phase modulator), according to an embodiment of the present invention.

Referring to FIG. 3, there is shown a radio frequency, digital-to-analog converter (RF-DAC) based phase modulator 300, according to an embodiment of the present invention. The RF-DAC based phase modulator 300 comprises a harmonic rejection RF-DAC 302, an RC low-pass filter (LPF) 304, and a limiter 306. The harmonic rejection RF-DAC 302 includes three parallel-connected in-phase/quadrature (I/Q) RF-DACs 308, 310, and 312. Each I/Q RF-DAC 308, 310, and 312 is configured to receive the same upsampled N-bit I and Q digital baseband signals $I_{BB,UP}[(N-1):0]$ and $Q_{BB,UP}[(N-1):0]$, but are driven by a multiphase set of square-wave I and Q local oscillator (LO) clocks $CK_0$, $CK_{45}$, $CK_{90}$, $CK_{135}$, $CK_{180}$, $CK_{225}$, $CK_{270}$, and $CK_{315}$, where each LO clock phase is shifted +/−45° with respect to its two adjacent LO clock phases. Here, "N" is a positive integer denoting the resolution of the RF-DAC based phase modulator 300. As will be explained in more detail below, the harmonic rejection RF-DAC 302 operates in conjunction with the RC LPF 304 to suppress $3^{rd}$-order and $5^{th}$-order harmonics produced during the phase modulation process, thus obviating the need for a bulky and difficult-to-integrate band-pass filter (BPF) to filter out the $3^{rd}$-order and $5^{th}$-order harmonic distortion and 3rd-order counter-intermodulation distortion (C-IMD3).

Figure 4:
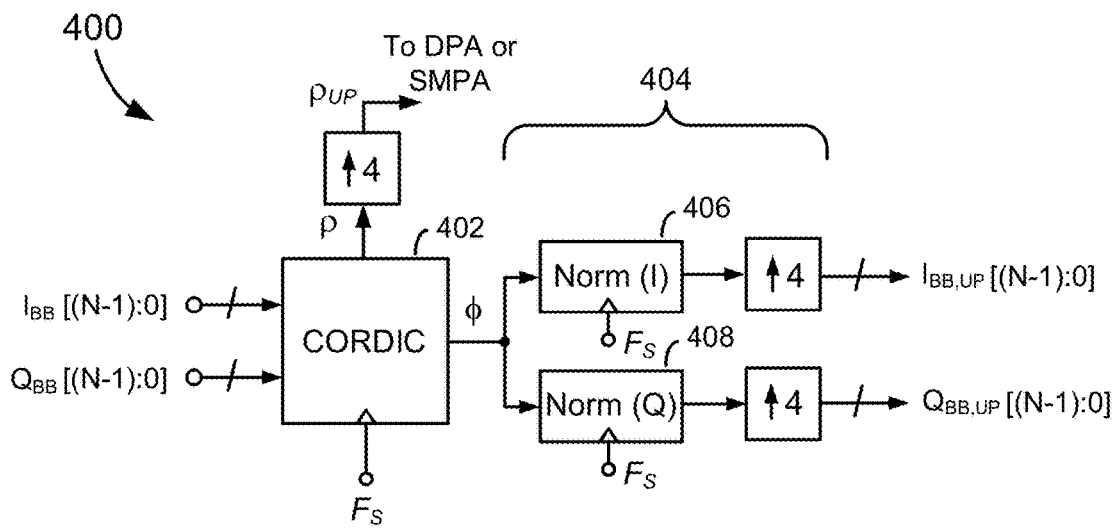
FIG. 4 is a functional block diagram illustrating the various digital operations performed at baseband to generate the upsampled I and Q digital baseband signals $I_{BB,UP}[(N-1):0]$ and $Q_{BB,UP}[(N-1):0]$ applied to the input of the RF-DAC based phase modulator depicted in FIG. 3, in accordance with one embodiment of the present invention.

FIG. 4 is a functional block diagram illustrating the various digital operations performed at baseband to generate the upsampled I and Q digital baseband signals $I_{BB,UP}[(N-1):0]$ and $Q_{BB,UP}[(N-1):0]$ applied to the input of the RF-DAC based phase modulator 300. First, I and Q digital baseband signals $I_{BB}[(N-1):0]$ and $Q_{BB}[(N-1):0]$, which are formatted according to some predetermined non-constant envelope modulation scheme (or, alternatively, and depending on the application, some predetermined constant envelope modulation scheme), are converted to polar coordinates by a CORDIC (COordinate Rotation DIgital Computer) converter 402. The resulting digital amplitude modulation component ρ is then upsampled (in this example by a factor of 4) and directed to the envelope control input of a digital power amplifier (DPA) in a digitally-intensive polar modulator. Alternatively, the upsampled digital amplitude modulation component $ρ_{UP}$ may be directed to the control input of a dynamic power supply (DPS) in a more conventional polar modulator. Meanwhile, the digital phase modulation component ϕ produced by the CORDIC converter 402 is directed to a ϕ-to-I/Q converter 404, which includes I and Q path normalizers 406 and 408 that convert the digital phase modulation component ϕ back into constant envelope, rectangular-coordinate I and Q signals. The normalized I and Q signals are then upsampled to the LO frequency and filtered by interpolation filters (not shown in the drawing) to suppress the spectral sampling replicas. Finally, the upsampled I and Q digital baseband signals $I_{BB,UP}[(N-1):0]$ and $Q_{BB,UP}[(N-1):0]$ are directed to the I and Q inputs of the harmonic rejection RF-DAC 302.

It should be mentioned that the sampling rate $F_S$ of the exemplary baseband apparatus depicted in FIG. 4 is one fourth (¼) the LO frequency $f_0$ so the x4 upsampled I and Q digital baseband signals $I_{BB,UP}[(N-1):0]$ and $Q_{BB,UP}[(N-1):0]$ have a bit rate equal to the LO frequency $f_0$. However, this x4 upsampling rate is not a necessary condition insofar as the invention is concerned, as will be appreciated and understood by those of ordinary skill in the art. It should also be mentioned that although the upsampling and interpolation filtering operations are shown in FIG. 4 to be performed in the I/Q domain, they could alternatively be performed in the phase domain, in other words prior to the phase modulation component ϕ being introduced to the ϕ-to-I/Q converter 404. Finally, it should be mentioned that, although the RF-DAC based phase modulator 300 is designed for use in a polar architecture, it, and the other embodiments of the RF-DAC based phase modulator disclosed herein, could be modified and adapted for use in non-polar architectures, in which case the input I and Q digital baseband signals $I_{BB}[(N-1):0]$ and $Q_{BB}[(N-1):0]$ could be upsampled to the LO frequency directly, in other words, without having to first convert them to polar coordinates.

Figure 5:
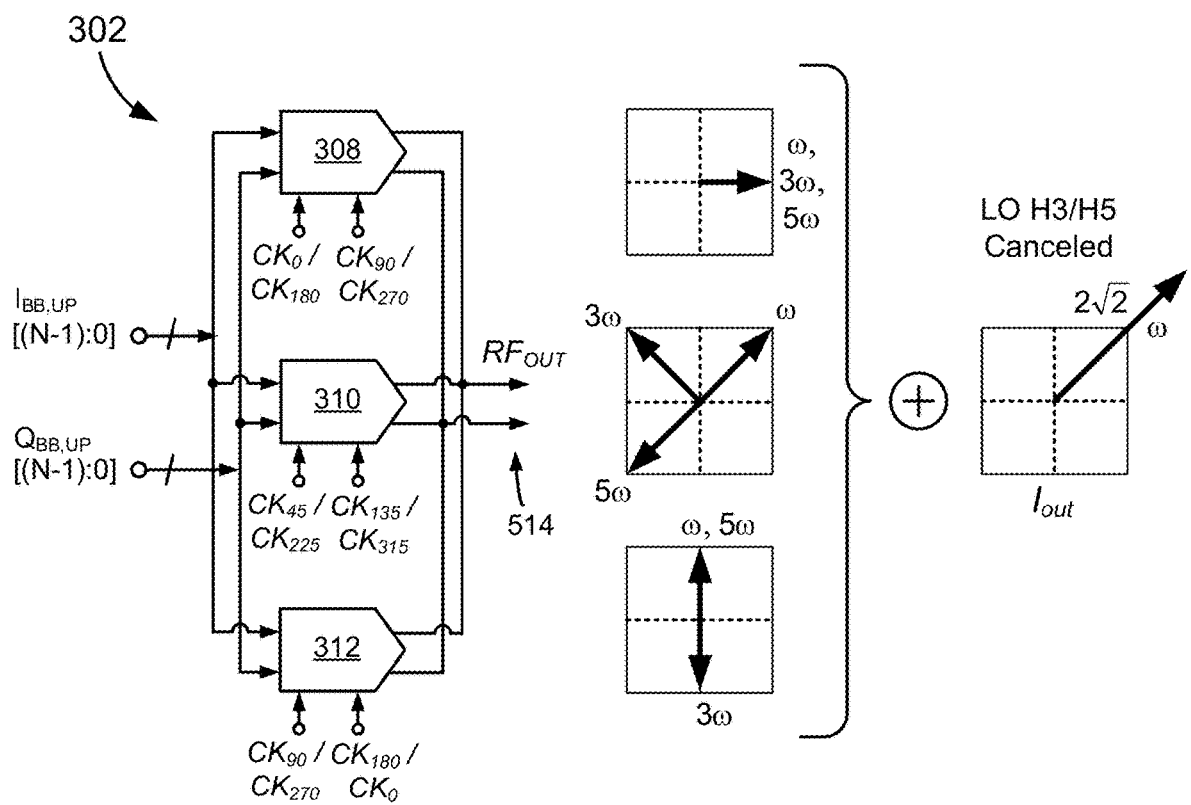
FIG. 5 is a drawing that vectorially illustrates, in the form of a phasor diagram, how the harmonic rejection RF-DAC of the RF-DAC based phase modulator depicted in FIG. 3 operates to cancel $3^{rd}$-order and $5^{th}$-order harmonics and thereby prevent (or at substantially minimize) $3^{rd}$-order and $5^{th}$-order harmonic distortion in the phase-modulated RF output of the RF-DAC based phase modulator.

When the in-phase LO clocks $CK_0$, $CK_{45}$ and $CK_{90}$ to the harmonic rejection RF-DAC 302 and the quadrature LO clocks $CK_{90}$, $CK_{135}$, $CK_{180}$ to the harmonic rejection RF-DAC 302 are expressed in two Fourier series and summed, it can be shown that the $3^{rd}$-order and $5^{th}$-order harmonics cancel. The harmonic rejection RF-DAC 302 exploits this Fourier principle to cancel $3^{rd}$-order and $5^{th}$-order harmonics during its operation and thereby prevent (or at least substantially minimize) $3^{rd}$-order and $5^{th}$-order harmonic distortion in its phase-modulated RF output. As illustrated vectorially in the phasor diagrams in FIG. 5, where the $3^{rd}$-order and $5^{th}$-order harmonics are referred to by their angular frequencies 3ω and 5ω, the sum of the $3^{rd}$-order and $5^{th}$-order harmonic contributions (3ω and 5ω) from all three I/Q RF-DAC 308, 310, and 312 add destructively to zero while the fundamental component (ω) contributions from the three RF-DACs add constructively to form a phasor: $2\sqrt{2}\angle 45°$. Note that the top and bottom RF-DACs 308 and 312 are designed to have a gain of 1 but the middle RF-DAC 310 is designed to have a gain of $\sqrt{2}$. This $\sqrt{2}$ scaling factor is used so that the desired cancellations occur properly.

It should be mentioned that the harmonic rejection RF-DAC 302 is not necessarily limited to having three RF-DACs 308, 310, and 312. For example, a fourth RF-DAC could be included to suppress $7^{th}$-order to $15^{th}$-order harmonics, in which case a set of eight multi-phase LO clock signals would be used to control the harmonic rejection RF-DAC.

Figure 6:
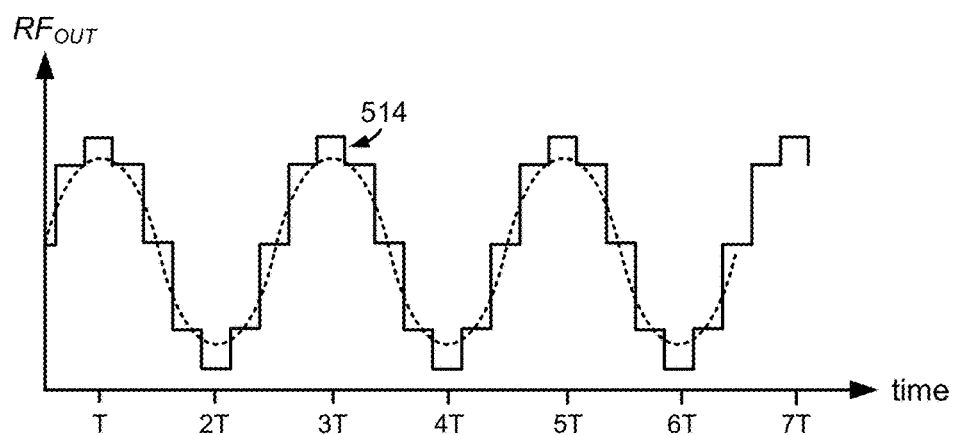
FIG. 6 is a signal diagram showing the general shape of the waveform of the phase-modulated RF signal produced at the output of the harmonic rejection RF-DAC of the RF-DAC based phase modulator depicted in FIG. 3.

The RC LPF 304 in the RF-DAC based phase modulator 300 (see FIG. 3) serves to suppress sampling replicas that are generated during baseband processing and that ultimately appear in the output RF spectrum of the RF-DAC based phase modulator 300. It also operates to smooth the waveform of the phase-modulated RF signal 514 produced by the harmonic rejection RF-DAC 302, thereby reducing its phase error. As can be seen in FIG. 6, the waveform of the phase-modulated RF signal 514 produced at the output of the harmonic rejection RF-DAC 302 somewhat resembles a sine wave. However, it is not smooth, has a finite number of magnitude levels, and has sharp transitions between the limited number of magnitude levels. After passing the signal through the RC LPF 304, however, the sharp transitions are removed and the phase error is reduced to the point that the waveform much more accurately resembles an ideal sinusoid. Operating in conjunction with the harmonic rejection RF-DAC 302, the RC LPF 304 is capable of reducing the phase error of the RF-DAC based phase modulator 300 to less than 0.4° when a $2^{nd}$-order RC LPF is used and to less than 0.1° when a $3^{rd}$-order RC LPF is used. The very low phase error obviates the need for a BPF, and since no large inductors are needed in the RF output filtering apparatus, the entire RF-DAC based phase modulator 300, including the RC LPF 304, harmonic rejection RF-DAC 302, and limiter 306 can be integrated in a single, compact integrated circuit (IC) chip. In one embodiment of the invention, the RF-DAC based phase modulator 300 was fabricated using a 40 nm complementary metal-oxide-semiconductor (CMOS) technology, resulting in an IC chip area of only 0.16 mm$^2$ and a power consumption of only 33 mW at an LO frequency of $f_0$=2.4 GHz.

The purpose of the limiter 306 in the RF-DAC based phase modulator 300 is to convert the analog signal produced at the output of the RC LPF 304 to a bi-level drive signal that is suitable for driving a PA, for example a DPA or a more conventional switch-mode PA (SMPA) in a polar modulator application. In one embodiment of the invention the input drive to the PA has CMOS logic levels and the limiter 306 comprises a multi-stage limiting amplifier and a digital buffer. According to this exemplary embodiment of the limiter 306, the input stage of the limiting amplifier is designed to have a bandwidth of $f_0$ (the frequency of the LO), allowing it to act as the second stage of the RC LPF 304, and the amplified analog signal produced by the limiting amplifier output stage is AC coupled to the digital buffer, which facilitates conversion of the amplified analog signal into its CMOS logic counterpart.

Figure 7:
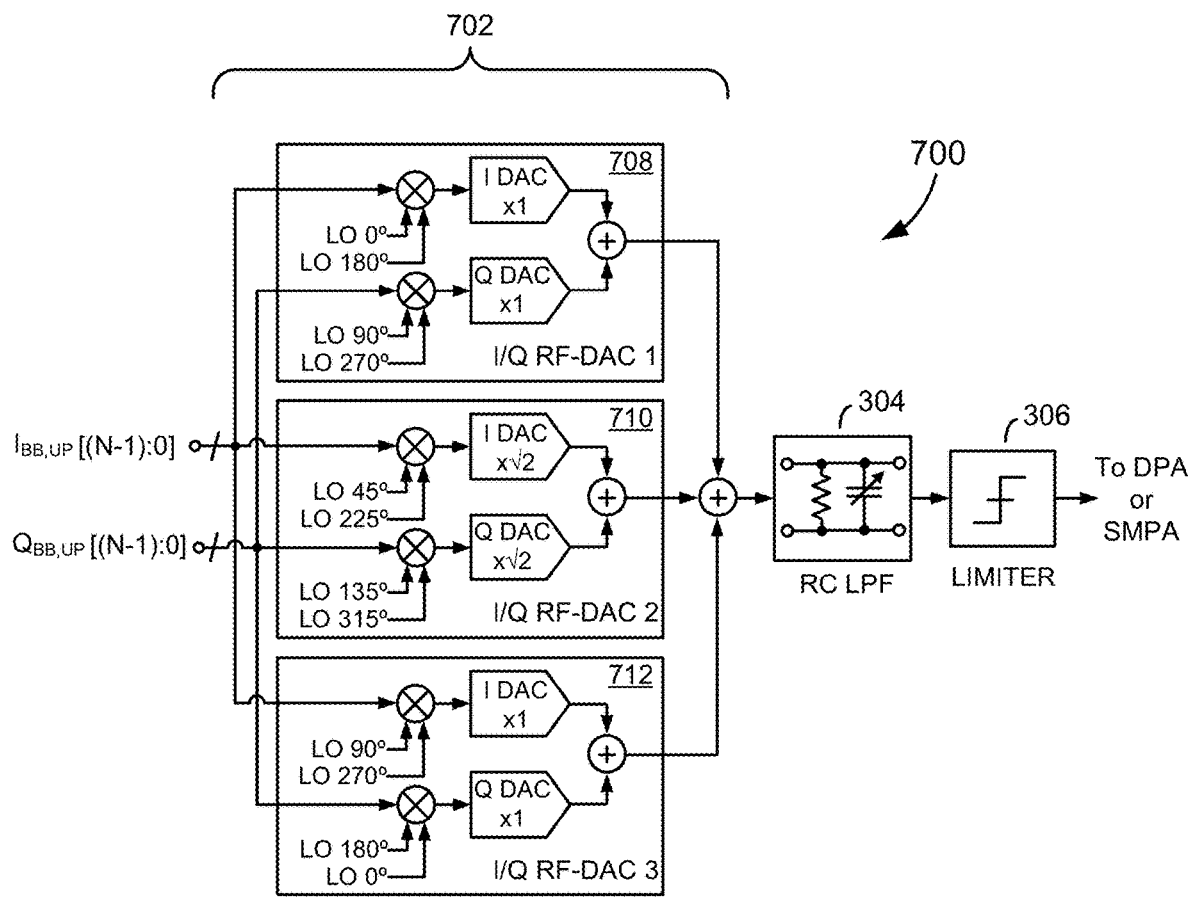
FIG. 7 is a more detailed drawing of the RF-DAC based phase modulator depicted in FIG. 3, according to one embodiment of the present invention.

FIG. 7 is a drawing showing in further detail the various elements that make up each of the I/Q RF-DACs 308, 310, and 312 in the harmonic rejection RF-DAC 302 of the RF-DAC based phase modulator 300, in accordance with one embodiment of the invention. Each I/Q RF-DAC 708, 710, and 712 includes an I-path digital mixer, an I-path DAC, a Q-path digital mixer, and a Q-path DAC. Further, the I-path digital mixers the I/Q RF-DACs 708, 710, and 712 are all configured to receive the upsampled in-phase digital baseband signal $I_{BB,UP}[(N-1):0]$; the I-path mixer in I/Q RF-DAC 708 is driven by LO clock phases LO 0° and LO 180°; the I-path mixer in I/Q RF-DAC 710 is driven by LO clock phases LO 45° and LO 225°; and the I-path mixer in I/Q RF-DAC 712 is driven by LO clock phases LO 90° and LO 270°. Meanwhile, the Q-path digital mixers the I/Q RF-DACs 708, 710, and 712 are configured to receive the upsampled quadrature digital baseband signal $Q_{BB,UP}[(N-1):0]$; the Q-path mixer in I/Q RF-DAC 708 is driven by LO clock phases LO 90° and LO 270°; the Q-path mixer in I/Q RF-DAC 710 is driven by LO clock phases LO 135° and LO 315°; and the Q-path mixer in I/Q RF-DAC 712 is driven by LO clock phases LO 180° and LO 0°. (Note that two LO clock phases of 180° separation are applied to each mixer, in order to support differential operation.) The I-path DAC and Q-path DAC in each of the I/Q RF-DACs 708, 710, and 712 converts their respective upconverted I and Q digital signals to I and Q analog signals, which are then summed to produce three separate analog phase-modulated RF signals that are 45° out of phase. Finally, the resulting three analog phase-modulated RF signals are summed to produce the harmonic-rejected analog phase-modulated RF signal that is applied to the input of the RC LPF 304.

Figure 8:
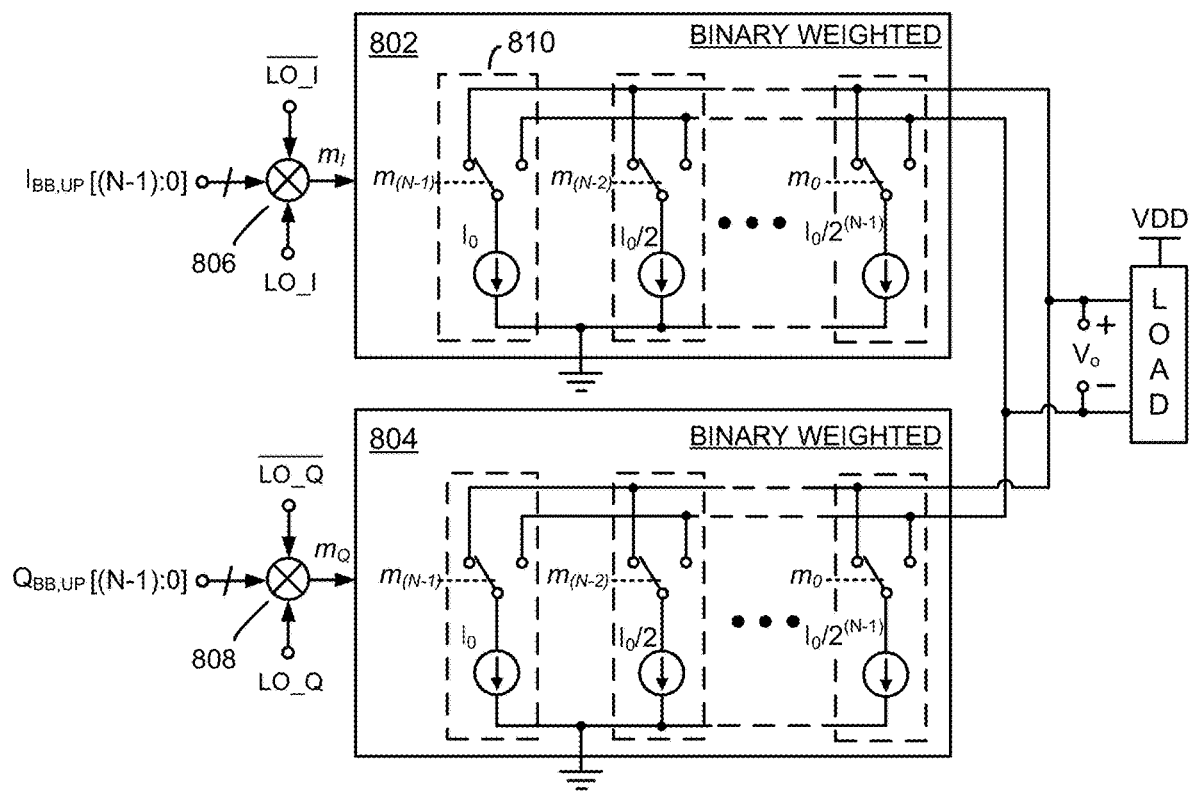
FIG. 8 is a schematic drawing of an I/Q pair of binary-weighted current steering RF-DACs that can be used to implement each of the three I/Q RF-DACs in the harmonic rejection RF-DAC depicted in FIG. 7, according to one embodiment of the present invention.

The I-path Q-path DACs in the I/Q RF-DACs 708, 710, and 712 can be constructed in various ways. In one embodiment of the invention, each DAC comprises a binary-weighted current steering DAC. FIG. 8 is a drawing illustrating how one pair (I and Q) of current steering DACs 802 and 804 is implemented in one of the three I/Q RF-DACs 708, 710, and 712, in accordance with this embodiment of the invention. The other two pairs of I and Q DACs are similarly constructed, except that the current sources in the I-path and Q-path DACs of the I/Q RF-DAC 710 are scaled by a factor of $\sqrt{2}$. The I-path and Q-path digital mixers 806 and 808 upconvert the upsampled I and Q digital baseband signals $I_{BB,UP}[(N-1):0]$ and $Q_{BB,UP}[(N-1):0]$ to RF, in accordance with LO clocks LO_I/$\overline{\text{LO\_I}}$ and LO_Q/$\overline{\text{LO\_Q}}$, which, for example, correspond to clock phases LO 0°/LO 180° and LO 90°/LO 270° applied to I/Q RF-DAC 708 in FIG. 7, producing I-path and Q-path RF digital code words $m_I$ and $m_Q$, each having N bits ($m_{N-1}, \ldots, m_0$), where $m_{N-1}$ represents the most significant bit (MSB) and $m_0$ represents the least significant bit (LSB). Each individual bit in the I-path and Q-path RF digital code words $m_I$ and $m_Q$ can have a logic value of "0" or a logic value of "1" and the logic value of each bit at any give time is used to control the position (open or closed) of a corresponding switch in the binary-weighted current steering DACs 802 and 804. Each switch is further connected in series with an associated current source, to form a DAC "cell" 810. Further, all N cells 810 in each binary-weighted current steering DAC 802 and 804 are connected in parallel. Accordingly, depending on the logic values of the bits in the I-path and Q-path digital code words $m_I$ and $m_Q$, the current sources in the binary-weighted current steering DAC 802 and 804 are connected to either the positive (+) output terminal of the I/Q RF-DAC pair 802 and 804 or the negative (−) output terminal. The digital code in the I-path and Q-path digital code words $m_I$ and $m_Q$ changes over time, depending on changes to the upsampled I and Q digital baseband signals $I_{BB,UP}[(N-1):0]$ and $Q_{BB,UP}[(N-1):0]$, thus affecting how many of the current sources are connected to the positive (+) output terminal compared to how many current sources connected to the negative (−) output terminal and, consequently, the magnitude of current that is sourced to the load. The magnitude of current flowing to the load, which in this case is the RC LPF 304, is therefore an analog representation of the digital phase modulation encoded in the I-path and Q-path digital code words $m_I$ and $m_Q$.

Figure 9:
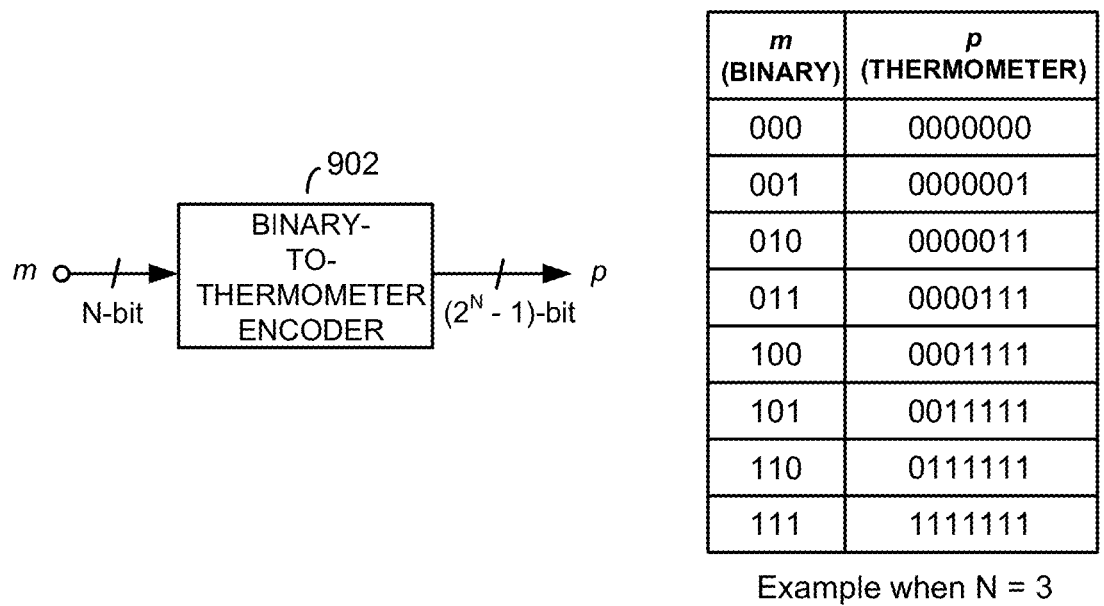
FIG. 9 is a schematic drawing of an I/Q pair of thermometer-coded current steering RF-DACs that can be used to implement each of the three I/Q RF-DACs in the harmonic rejection RF-DAC depicted in FIG. 7, according to one embodiment of the present invention.
Figure 9:
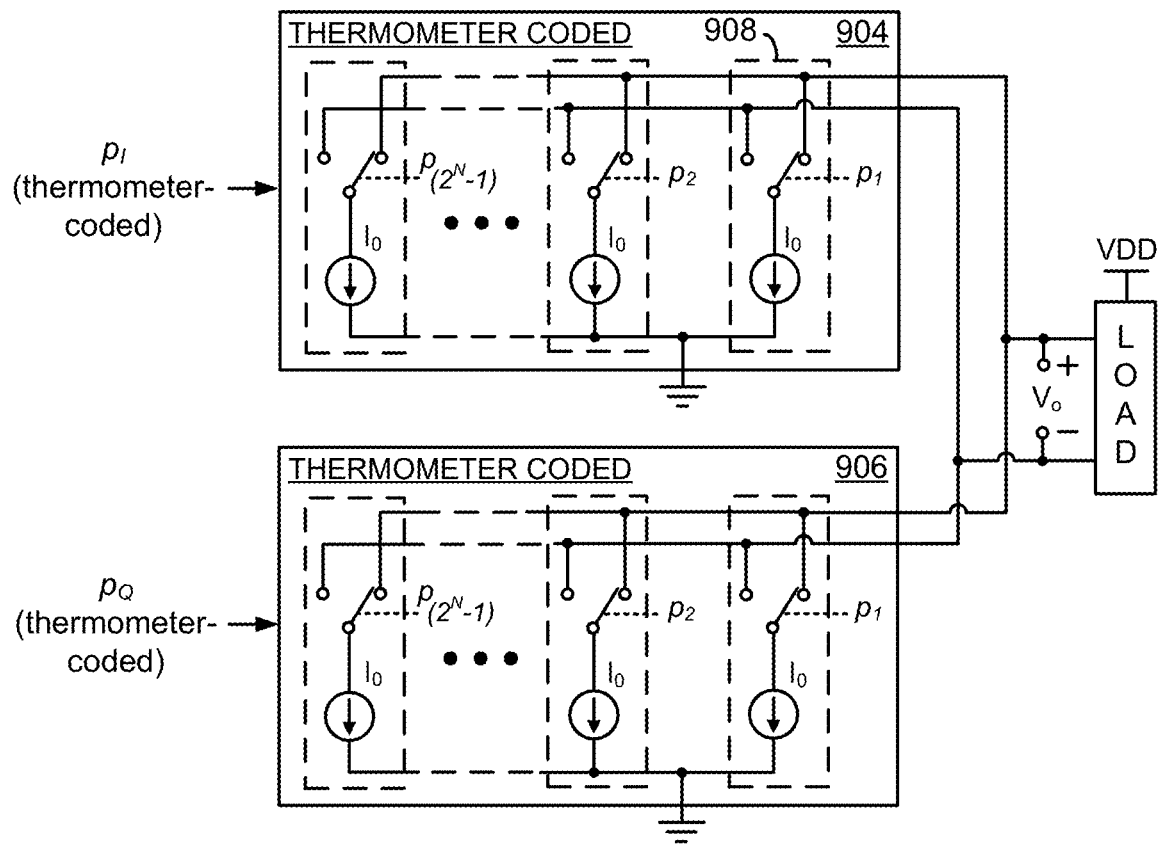

The binary-weighted current steering DACs 802 and 804 can be susceptible to manufacturing mismatches due to the different-sized current sources $I_0, I_0/2, \ldots, I_0/2^{(N-1)}$. They also produce glitch impulses in their analog outputs as the bits in the I-path and Q-path digital code words $m_I$ and $m_Q$ change logic values. In some applications, the mismatch and glitch energy may not be a problem. In any event, and in accordance with another embodiment of the invention, each of pair of I/Q DACs making up the current steering DAC pairs in the I/Q RF-DACs 708, 710, and 712 can be alternatively implemented as a "unary-weighted" or "thermometer-coded" current steering DAC pair 904 and 906, as illustrated in FIG. 9. According to this alternative embodiment of the invention, the N-bit binary-coded I-path and Q-path digital code words $m_I$ and $m_Q$ are first converted to thermometer code by a binary-to-thermometer encoder 902. An N-bit binary-to-thermometer encoder produces ($2^N$−1) unique codes. For example, as illustrated in the binary-to-thermometer truth table presented in FIG. 9, which is for the case of an input binary-coded digital word of N=3 bits, the binary-to-thermometer encoder produces $2^N-1=2^3-1=7$ unique codes (ignoring 000). The number of logic "1s" in each thermometer code also corresponds to the decimal equivalent of the binary code from which it is encoded. For example, a binary code of 101 (decimal equivalent 5) results in a 7-bit thermometer code of 0011111 having five (5) logic "1s." A benefit that follows from this property is that in all instances a change in the analog output waveform level from one level to an adjacent level, either up or down, is affected by changing only a single bit in the thermometer code. This property is desirable in the operation of a current steering DAC since it minimizes glitch energy in the analog output waveform.

Similar to as in the binary-weighted current steering DAC pair 802 and 804 discussed above in reference to FIG. 7, each bit in the thermometer-coded I-path and Q-path digital code words $p_I$ and $p_Q$ produced by the binary-to-thermometer encoder 902 in the thermometer-coded approach illustrated in FIG. 9 is used to control a corresponding switch in the thermometer-coded current steering DAC pair 904 and 906. However, unlike the binary-weighted current steering DACs 802 and 804, which each only have N unit cells 810, the thermometer-coded current steering DACs 904 and 906 have ($2^N$−1) unary-weighted unit cells 908. The word "unary" is used here to mean that the current sources in each of the unit cells 904 has the same size, i.e., same current magnitude compared to the current sources in the binary-weighted current steering DACs 802 and 804 which have different sizes: $I_0, I_0/2, \ldots, I_0/2^{(N-1)}$.

The thermometer-coded current steering DACs pair 904 and 906 are less susceptible to current source manufacturing mismatches compared to the binary-weighted current steering DACs 802 and 804, and because only a single bit in the thermometer code needs to change in order to change the analog output by one level, the thermometer-coded current steering DAC pair 904 and 906 tends to produce less glitch energy. For these reasons, the RF-DAC phase modulator 700 is, in general, more accurate when the I-path and Q-path DACs in the harmonic rejection RF-DAC 702 are implemented using the thermometer-coded approach depicted in FIG. 9 compared to if implemented using the binary-weighted approach depicted in FIG. 8. However, this accuracy advantage is gained at the expense of increased IC area, power consumption, and layout complexity. As can be seen by comparing FIGS. 8 and 9, only N unit cells are needed to construct the binary-weighted current steering DACs 802 and 804, whereas ($2^N$−1) cells are needed to construct the thermometer-coded current steering DACs 904 and 906. The binary-weighted current steering DACs 802 and 804 also have the advantage of not requiring an encoder, since the binary-weighted unit cells 810 can be directly switched by the I-path and Q-path digital code words $m_I$ and $m_Q$.

Figure 10:
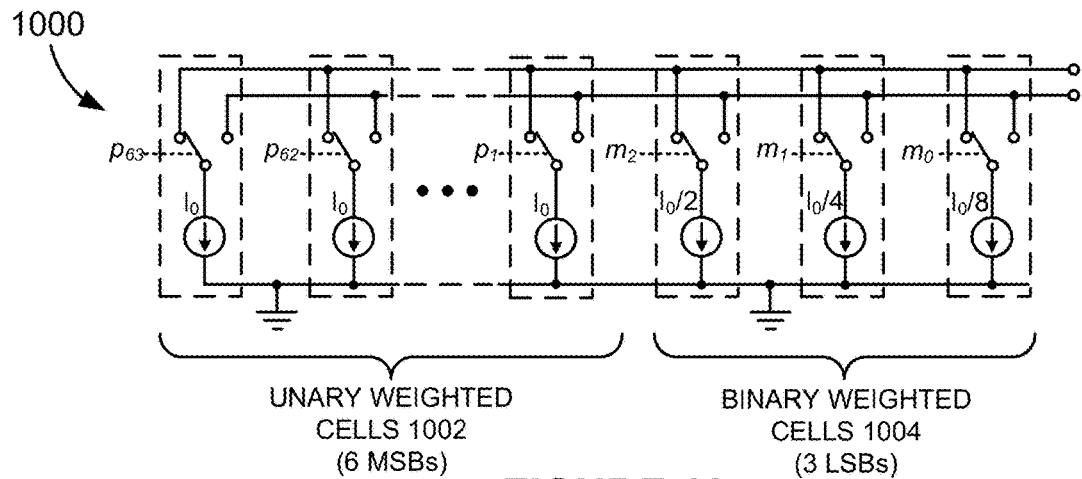
FIG. 10 is a schematic drawing of a combined binary-weighted and thermometer-coded current steering DAC that can be used to implement each of the six DACs in the harmonic rejection RF-DAC depicted in FIG. 7, according to one embodiment of the present invention.

The size, power dissipation, and layout difficulty of a fully thermometer-coded current steering DAC increase dramatically as the resolution N of the DAC increases. Yet in many applications a high resolution N is needed in order to satisfy strict modulation accuracy and noise limitation requirements. In some applications the required IC area can become prohibitive and layout of the many signal traces for the encoding logic can be extremely difficult. To ameliorate these problems and best take advantage of the various advantages offered by both the binary-weighted and thermometer-coded approaches, in one embodiment of the invention each of the DACs in the I/Q RF-DACs 708, 710, and 712 of the harmonic rejection RF-DAC 702 is implemented as a combined binary-weighted and thermometer-coded current steering DAC 1000, as illustrated in FIG. 10. The exemplary combined binary-weighted and thermometer-coded current steering DAC 1000 has a resolution of N=9 and comprises ($2^{N_T}$−1)=63 thermometer-coded (unary-weighted) unit cells 1002, where $N_T$=6 refers to the 6 MSBs of the N=9-bit RF digital code word $m=(m_{N-1}, \ldots, m_0)$, and $N_B$=3 binary-weighted unit cells 1004 connected in parallel with the thermometer-coded units cells 1002, thus providing the ability to produce $2^{N_T} \times 2^{N_B} = 2^{(N_T+N_B)} = 2^9 = 512$ analog output levels. The $N_T$=6 MSBs of the input digital code word $m=(m_{N-1}, \ldots, m_0)$ are converted to thermometer code by a $N_B$-to-($2^{N_T}$−1)=3-to-63 binary-to-thermometer encoder (not shown) and the resulting 63-bit thermometer-code words are used to control switches $p_{63}, p_{62}, \ldots, p_1$ in the 63 thermometer-coded unit cells 1002. The remaining $N_T$=3 LSBs of the input digital code word $m=(m_{N-1}, \ldots, m_0)$ are used to directly control switches $m_2, m_1, \ldots, m_0$ in the 3 binary-weighted unit cells 1004.

Figure 11:
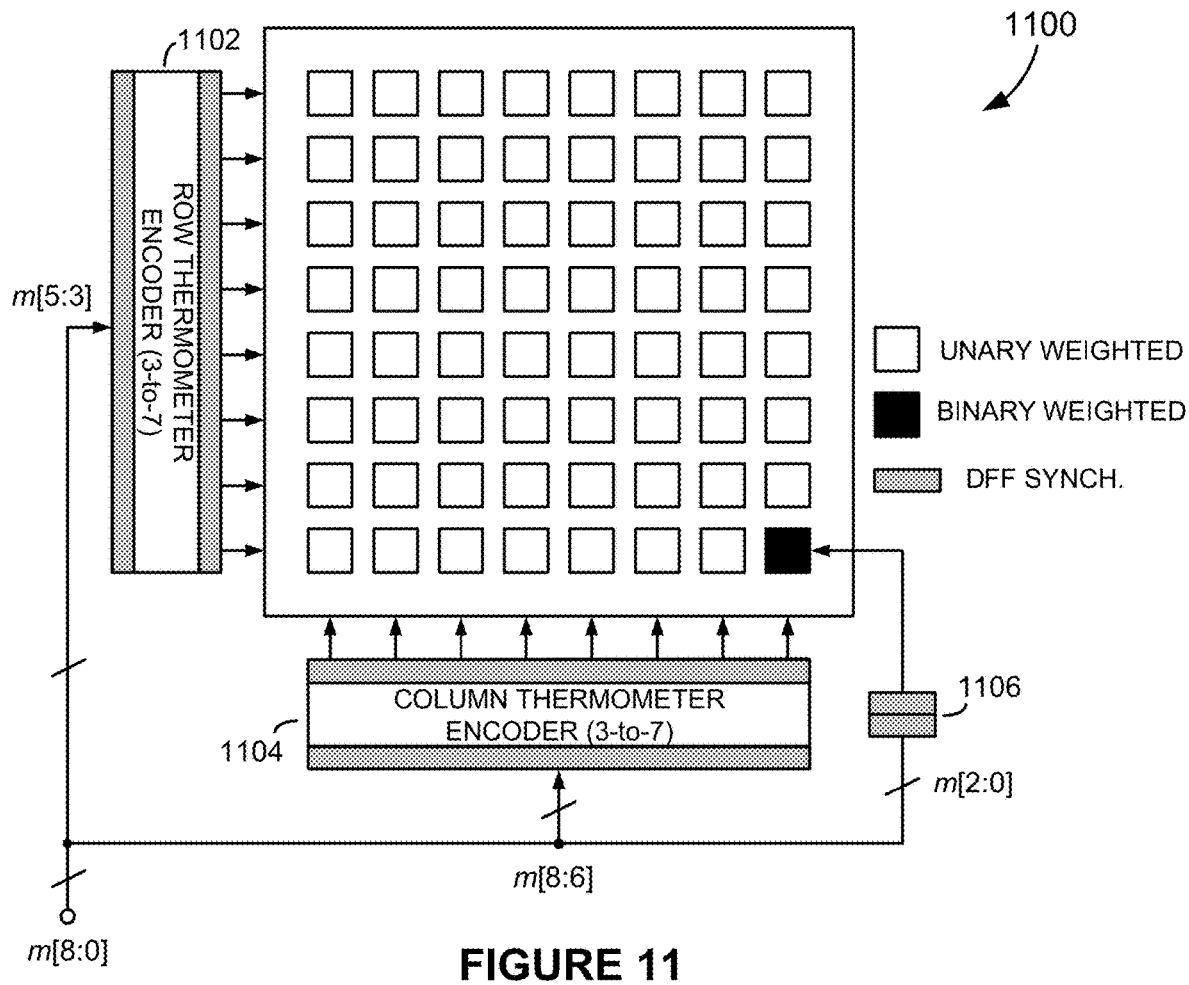
FIG. 11 is a drawing illustrating how the combined binary-weighted and thermometer-coded current steering DAC depicted in FIG. 10 can be arranged, along with row and column binary-to-thermometer encoders, in a two-dimensional grid or "array," in accordance with one embodiment of the present invention.

When integrated in an IC, the combined binary-weighted and thermometer-coded current steering DAC 1000 has a significantly smaller footprint than a corresponding fully thermometer-coded DAC. Instead of requiring ($2^N$−1)=$2^9$−1=511 units cells to form a fully thermometer-coded DAC, only ($2^{N_T}$−1)=$2^6$−1=63 thermometer-coded (unary-weighted) cells in combination with $N_B$=3 binary-weighted cells are needed. Further, since only $N_B$=3 binary-weighted cells are used for the 3 LSBs, manufacturing intolerances are less severe and glitch energy is significantly less of an impact compared to if the DAC was constructed entirely from binary-weighted unit cells. The footprint of the combined binary-weighted and thermometer-coded current steering DAC 1000 can be further reduced by arranging the 63 unary-weighted and 3 binary-weighted cells in a two-dimensional grid or "array," as illustrated in FIG. 11, and by utilizing separate row and column 3-to-7 binary-to-thermometer encoders 1102 and 1104, instead of a single and more complicated 3-to-63 binary-to-thermometer encoder. (Note that in this exemplary embodiment of the combined binary-weighted and thermometer-coded current steering DAC 1100, D flip-flops (DFFs) are used both before and after the row and column 3-to-7 binary-to-thermometer encoders 1102 and 1104 to prevent encoder switch energy from appearing in the switch drive signals that control operation of the thermometer-coded DAC switches. Also note that a pair of DFFs 1106 is also included in the binary path to ensure that it has the same delay.)

Aside from digital-to-analog conversion, another principal function of the harmonic rejection RF-DAC 302 is upconverting the upsampled I and Q digital baseband signals $I_{BB,UP}[(N-1):0]$ and $Q_{BB,UP}[(N-1):0]$ to RF. In conventional RF transmitters, this upconversion process is typically performed after the digital-to-analog conversion process. In contrast, in the harmonic rejection RF-DAC 302, upconversion is performed in the digital domain, i.e., before the digital-to-analog conversion process, and on a bit-by-bit basis. This approach leads to a more digitally-intensive design and avoids having to rely on analog mixers, which are less amenable to integrated circuit fabrication and have a number of other drawbacks, including limited tuning bandwidths and often poor noise performance. Although the LO clocks that drive the digital mixers in the present invention have square waveforms and the digital mixers are themselves an undesirable source of LO harmonic generation, together the harmonic rejection capability of the harmonic rejection RF-DAC 702 and RC LPF 304 substantially cancel the harmonic content and prevent it from manifesting as harmonic distortion in the RF-DAC based phase modulator's 700's RF output spectrum.

Figure 12:
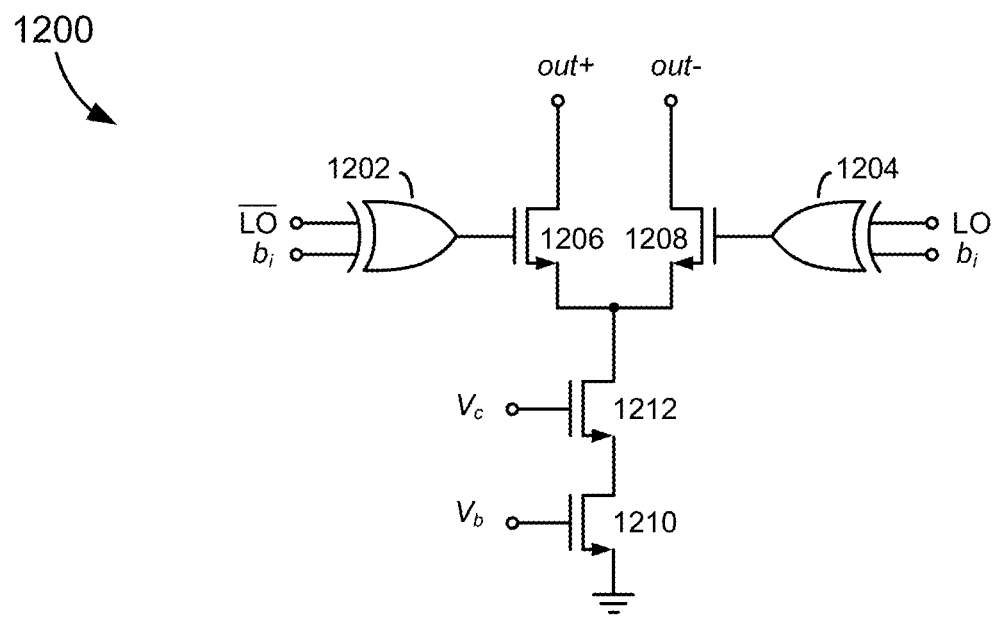
FIG. 12 is a schematic drawing showing one way in which each unit cell in each I/Q current steering DAC in each of the I/Q RF-DACs of the harmonic rejection RF-DAC depicted in FIG. 7 may be constructed, in accordance with one embodiment of the present invention.

FIG. 12 is a schematic drawing showing one way in which each unit cell in each of the I/Q current steering DACs described above may be constructed, highlighting how the unit cell 1200 operates to upconvert a given data bit $b_i$, in one of the upsampled I and Q digital baseband signals to RF in the digital domain. (Note that the input bit "$b_i$" refers to either a bit in a thermometer-coded input word or a bit in a binary-coded input word, depending on whether the unit cell 1200 is serving as a unit cell in the thermometer-coded portion of the DAC array 1000 or is serving as a unit cell in the binary-weighted portion of the DAC array 1000.) Each unit cell 1200, which may more aptly be referred to as a "mixing DAC unit cell" 1200 comprises first and second exclusive (XOR) logic gates 1202 and 1204, first and second switching field-effect transistor (FET) 1206 and 1208, and current source FETs 1210 and 1212. The current source FETs 1210 and 1212 are biased by bias voltages $V_b$ and $V_c$, which forces the current source FETs 1210 and 1212 to be maintained in saturation during operation, and are sized depending on whether the particular mixing DAC unit cell 1200 is a unit cell in the thermometer-coded portion of the combined binary-weighted and thermometer-coded current steering DAC 1000 or is a unit cell in the thermometer-coded portion of the combined binary-weighted and thermometer-coded current steering DAC 1000. (Note that a single current source FET 1210 could be used, instead of using both current source FETs 1210 and 1212; however, including the cascode current source FET is beneficial since it increases the output impedance of the DAC and consequently helps minimize DAC nonlinearities.) Further, if the particular mixing DAC unit cell 1200 is a member of the middle I/Q RF-DAC 710 in the harmonic rejection RF-DAC 702, the current source transistors 1210 and 1212 are scaled to have a gate width (W) to length (L) ratio W/L x$\sqrt{2}$ greater than the W/L ratio of the current source transistors in the mixing DAC unit cells used in the upper and lower I/Q RF-DAC 708 and 712. The complementary LO clock signals LO/$\overline{\text{LO}}$, which explained above are square waves, are applied to the first and second XOR gates 1202 and 1204 and correspond to one of the six LO clock pairs shown in FIG. 7, depending on which I/Q RF-DAC 708, 710, or 712 the mixing DAC unit cell 1200 is a member of. The first and second XOR gates 1202 and 1204 serve as a bit-wise RF mixer. For a given logic value of the input data bit $b_i$ ("0" or "1"), the outputs of the first and second XOR gates 1202 and 1204 (which together may be referred to as "mixing logic") cause the first and second switching field-effect transistor FETs 1206 and 1208 to switch ON or OFF. This in turn causes the output current of the mixing DAC unit cell 1200 to switch (or "steer") between either the positive or negative output node out+ or out−. Subsequently, when the input data bit $b_i$ changes logic state, the polarity of the output current waveform is reversed. In this manner, digital mixing of the input data bit stream with the LO is achieved. It should be mentioned that although the DAC unit cells 810, 908, 1002 and 1004 in the binary-weighted, thermometer coded, and combined binary-weighted and thermometer-coded current steering DACs 802/804, 904/906, and 1000 described above is each shown to include just a switch and current source, when the unit cells are constructed according to the mixing DAC unit cell 1200 depicted in FIG. 12 (or FIG. 13 below), each unit cell actually includes the first and second XOR gates 1202 and 1204, which as just explained serve as a bit-wise RF mixer. Including the bit-wise RF mixing logic in the unit cell thus transforms each DAC unit cell 810, 908, 1002 and 1004 in the binary-weighted, thermometer coded, and combined binary-weighted and thermometer-coded current steering DACs 802/804, 904/906, and 1000 describe above (see FIGS. 8, 9, and 10) into what may be referred to as an "RF-DAC unit cell" (or "mixing DAC unit cell," as was also just suggested) rather than a "DAC unit cell," the "RF" and "mixing" prefixes included to emphasize the fact that each unit cell 1200 not only contributes to the digital-to-analog conversion process but also to the upconversion of its corresponding input digital bit $b_i$ to the LO frequency.

Figure 13:
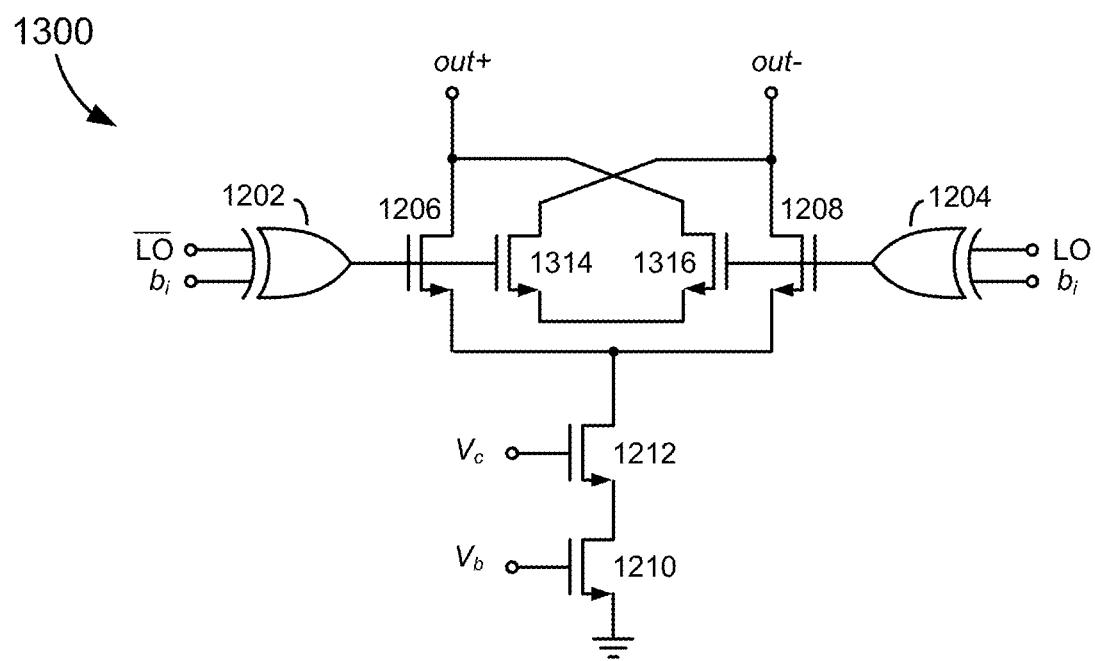
FIG. 13 is a schematic drawing showing another way in which each unit cell in each I/Q current steering DAC in each of the I/Q RF-DACs of the harmonic rejection RF-DAC depicted in FIG. 7 may be constructed, in accordance with one embodiment of the present invention

FIG. 13 is a schematic drawing of another mixing DAC unit cell 1300 that may be used. The mixing DAC unit cell 1300 is similar in construction to the mixing DAC unit cell 1200 depicted in FIG. 12, except that it further includes "dummy" FETs 1314 and 1316 to address undesired charge injection through the gate-drain parasitic capacitances $C_{gd}$ of the switching FETs 1206 and 1208. The switching FETs 1206 and 1208 and dummy FETs 1314 and 1316 all have the same size. Consequently, all four FETs have the same $C_{gd}$. The gates of dummy FETs 1314 and 1316 are connected to the gates of switching FETs 1206 and 1208, respectively, but the drains are cross-connected. Absent the dummy FETs 1314 and 1316, charge injection through the drain parasitic capacitances $C_{gd}$ of the switching FETs 1206 and 1208 occurs at the frequency of the LO clock. This LO feed-through leads to voltage and current spikes in the output analog waveform produced across the differential output terminals out+ and out−. Depending on the application, the LO feed-through and resulting voltage and current spikes may or may not be a problem. In situations where it is a problem, the mixing DAC unit cell 1300 can be used, instead of the mixing DAC unit cell 1200. Cross-coupling the drains of the dummy FETs 1314 and 1316 operates to effectively cancel the charge injection and LO feed-through problem through the parasitic capacitances $C_{gd}$ of the switching FETs 1206 and 1208, thereby preventing charge injection spikes from developing in the output analog waveform.

Figure 14:
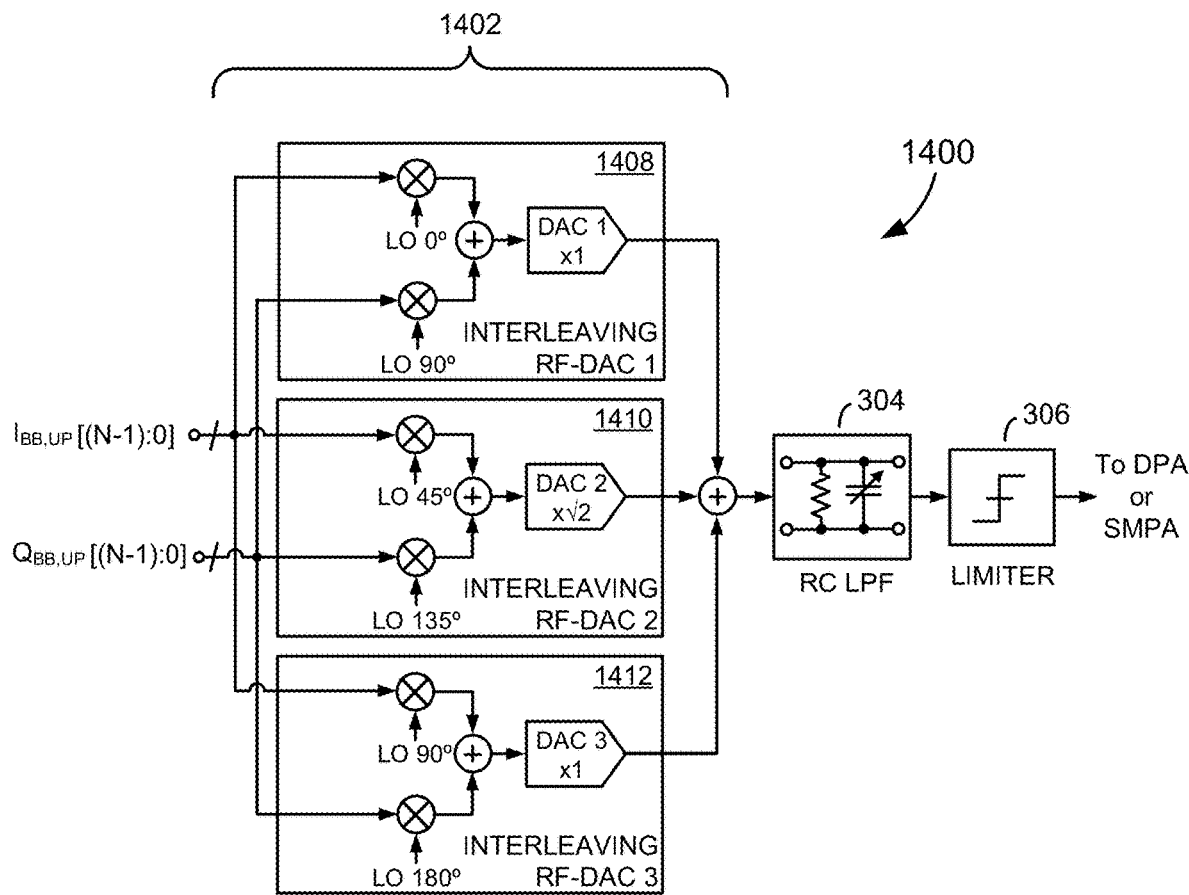
FIG. 14 is a more detailed drawing of the RF-DAC-based phase modulator depicted in FIG. 3, according to another embodiment of the present invention.

In the exemplary embodiment of the invention described above, each I/Q RF-DAC 708, 710, and 712 (see FIG. 7) in the harmonic rejection RF-DAC 702 of the RF-DAC based phase modulator 700 is constructed from an I DAC and a Q DAC. In other words, each I/Q RF-DAC 708, 710 includes two DACs—one for the I path and a second for the Q path. FIG. 14 is a drawing showing an RF-DAC based phase modulator 1400, according to another embodiment of the invention. The RF-DAC based phase modulator 1400 includes an RC LPF 1404, which similar to the RC LPF 304 in the RF-DAC based phase modulator 700 serves to suppress sampling replicas generated during baseband processing and smooth the output waveform of the phase-modulated RF signal produced by the harmonic rejection RF-DAC 702. However, instead of the harmonic rejection RF-DAC 702 being comprised of three I/Q RF-DACs 708, 710, and 712, each having an I-path current steering DAC and a Q-path current steering DAC (for a total of six current steering DACs), the harmonic rejection RF-DAC 1402 in the RF-DAC based phase modulator 1400 comprises three "interleaving" RF-DACs 1408, 1410, and 1412, each having just one "interleaving" current steering DAC.

Figure 15:
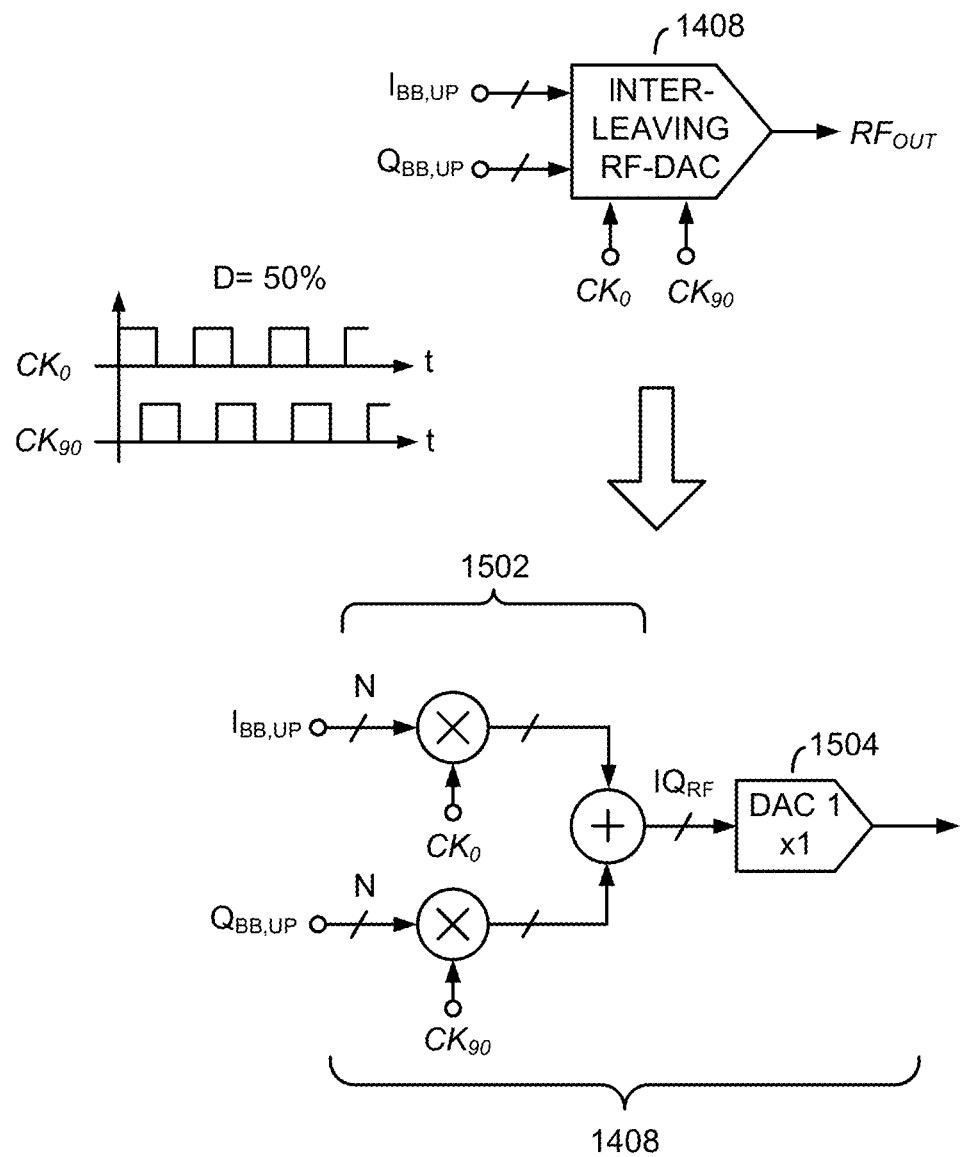
FIG. 15 is a drawing that illustrates the interleaving, frequency upconversion, and digital-to-analog conversion operations performed by each of the interleaving RF-DACs in the harmonic rejection RF-DACs of the RF-DAC based phase modulator depicted in FIG. 14.

FIG. 15 is a drawing that illustrates how one of the interleaving RF-DACs 1408, 1410, and 1412 in the harmonic rejection RF-DAC 1402, specifically, interleaving RF-DAC 1408, operates. The interleaving RF-DAC 1408 comprises an N-bit digital I/Q mixer 1502 followed by an N-bit current-steering DAC 1504, which may be implemented as described above, for example, as shown in FIGS. 10 and 11. The N-bit digital IQ mixer 902 mixes the upsampled N-bit digital I and Q digital baseband signals $I_{BB,UP}[(N-1):0]$ and $Q_{BB,UP}[(N-1):0]$ produced by the digital baseband circuitry (see FIG. 4 above) with RF in-phase and quadrature LO clocks $CK_0$ and $CK_{90}$ provided by a multi-phase LO clock signal generator (not shown). The I and Q LO clocks $CK_0$ and $CK_{90}$ are 90° out of phase, so the resulting RF-translated signal is an interleaved RF digital I-Q signal $IQ_{RF}$. The interleaved RF digital I-Q signal $IQ_{RF}$ is then introduced to the current-steering DAC 1504, which converts the upconverted digital samples to the final desired modulated analog RF waveform. The other two interleaving RF-DACs 1410 and 1412 in the harmonic rejection RF-DAC 1402 operate similarly (except that, again, the middle interleaving RF-DAC 1410 has DAC unit cells that are scaled by a factor of $\sqrt{2}$).

One significant advantage provided by the interleaving RF-DACs 1408, 1410, and 1412 is that the I and Q data bits produced by the digital I/Q mixer 1502 in each interleaving RF-DAC unit cell are interleaved, i.e., are time-multiplexed. This allows the I and Q bits in the interleaved RF digital I-Q signal $IQ_{RF}$ in each RF-DAC unit cell to share the same current steering DAC. In other words, interleaving the upconverted I and Q data in the digital domain effectively reduces the DAC resources to half that needed in the non-interleaved RF-DAC structure described above in reference to FIG. 7. The reduced number of DACs not only provides a more energy efficient solution, it results in a smaller IC footprint for the RF-DAC based phase modulator 700, less parasitics, and better image rejection capability since I-path/Q-path mismatch in each unit cell is practically eliminated.

Figure 16:
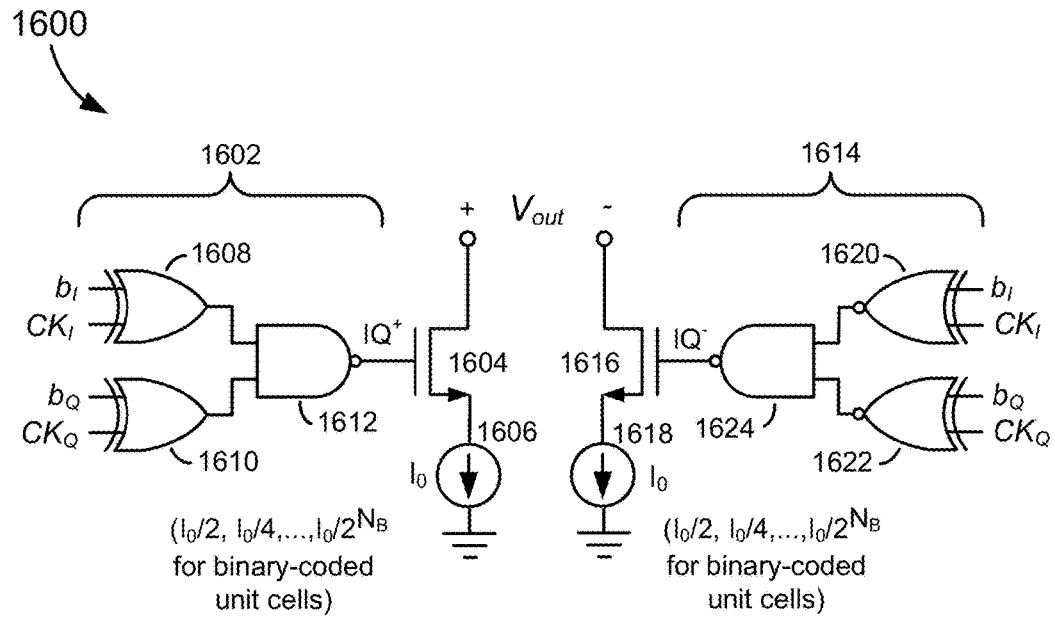
FIG. 16 is a schematic drawing showing one way that each unit cell in each of the three DACs in each of the three interleaving RF-DACs of the harmonic rejection RF-DAC depicted in FIG. 14 may be constructed, in accordance with one embodiment of the present invention.

FIG. 16 is a schematic drawing of an exemplary interleaving RF-DAC unit cell 1600 that may be used in the current steering DACs of each of the interleaving RF-DACs 1408, 1410, and 1412, according to one embodiment of the invention. With proper scaling, the interleaving RF-DAC unit cell 1600 may be used as a unit cell in the binary-weighted current steering DACs 802 and 804 (see FIG. 8), a unit cell in the fully thermometer-coded current steering DACs 904 and 906 (see FIG. 9), or to implement both the unary-weighted and binary-weighted unit cells in the combined binary-weighted and thermometer-coded current steering DAC described above in reference to FIGS. 10 and 11. The interleaving DAC unit cell 1600 includes a first interleaver 1602, a second (complementary) interleaver 1614, first and second switching FETs 1604 and 1616, and first and second current sources 1606 and 1618 connected in series with the first and second switching FETs 1604 and 1616. The first interleaver 1602 comprises first and second exclusive XOR logic gates 1608 and 1610 and a NAND logic gate 1612 (or their collective De Morgan equivalent), and the second interleaver 1614 comprises first and second exclusive NOR (XNOR) logic gates 1620 and 1622 and a NAND logic gate 1624 (or their collective De Morgan equivalent). The first and second interleavers 1602 and 1614 translate I and Q input data bits $b_I$ and $b_Q$ to RF to produce interleaved RF drive signals $IQ^+$ and $IQ^-$, which control the ON/OFF status of the first and second switching FETs 1604 and 1616. The output currents $I_{OUT+}$ and $I_{OUT-}$ of all interleaving RF-DAC unit cells in all three current steering DACs making up the interleaving RF-DACs 1408, 1410, and 1412 are summed at a common output and the total output current varies depending on the bit patterns in the I and Q bit streams directed to each unit cell, thus allowing the harmonic rejection RF-DAC 1502 to produce $2^N$ distinct output levels.

Figure 17:
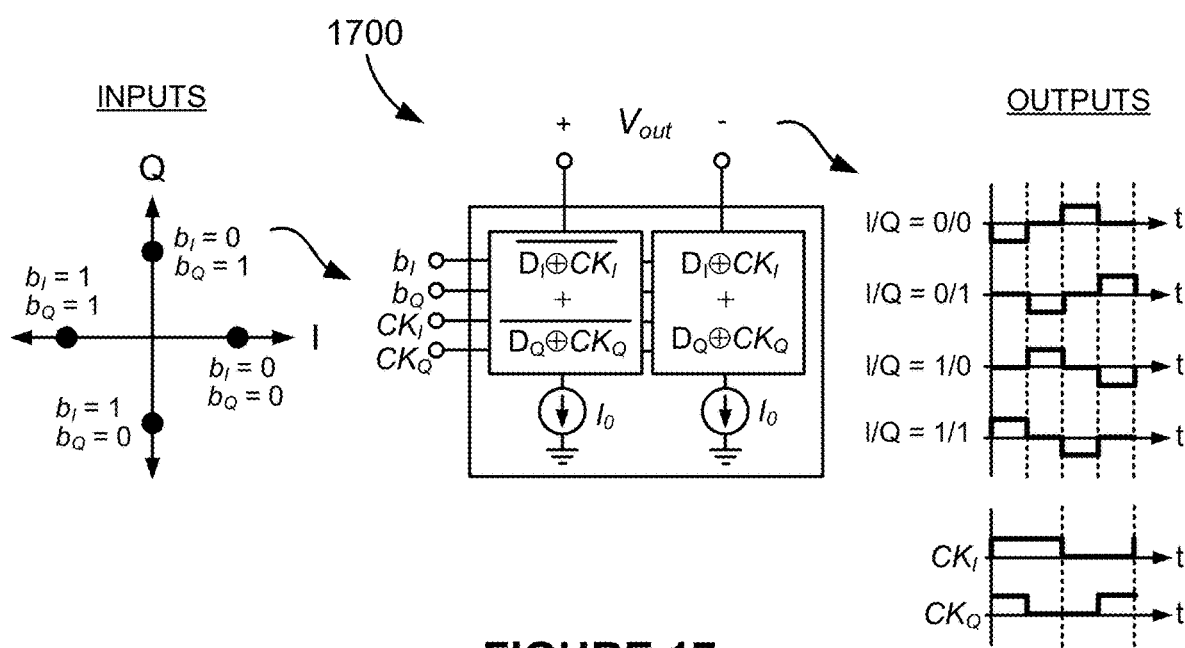
FIG. 17 is a drawing that illustrates how the XOR/OR combinatorial logic of the interleavers in the interleaving RF-DAC unit cell depicted in FIG. 16 is capable of producing four unique, 25% duty cycle, non-overlapping output waveforms covering all four quadrants of the I/Q signal plane.

The I and Q bits applied to each interleaving DAC unit cell 1600 do not have the same value at the same time. It is this exclusivity that allows the I and Q bits to be interleaved (i.e., time-multiplexed) and for the I and Q bits in the interleaved I and Q bit streams to then share the same DAC resources. As shown in FIG. 17, due to the unique XOR/OR combinatorial logic used for the interleavers 1602 and 1604, each interleaving DAC unit cell 1700 is capable of producing four unique, 25% duty cycle, non-overlapping output waveforms covering all four quadrants of the I/Q signal plane, even while using LO clocks $CK_I$ and $CK_Q$ having a duty cycle D=50%. This capability avoids having to introduce complicated clipping circuitry to address I/Q waveform overlap. It also avoids having to generate LO clocks of less than 50%, which is difficult to realize, particularly at GHz frequencies, and which results in a significant increase in power consumption.

Figure 18:
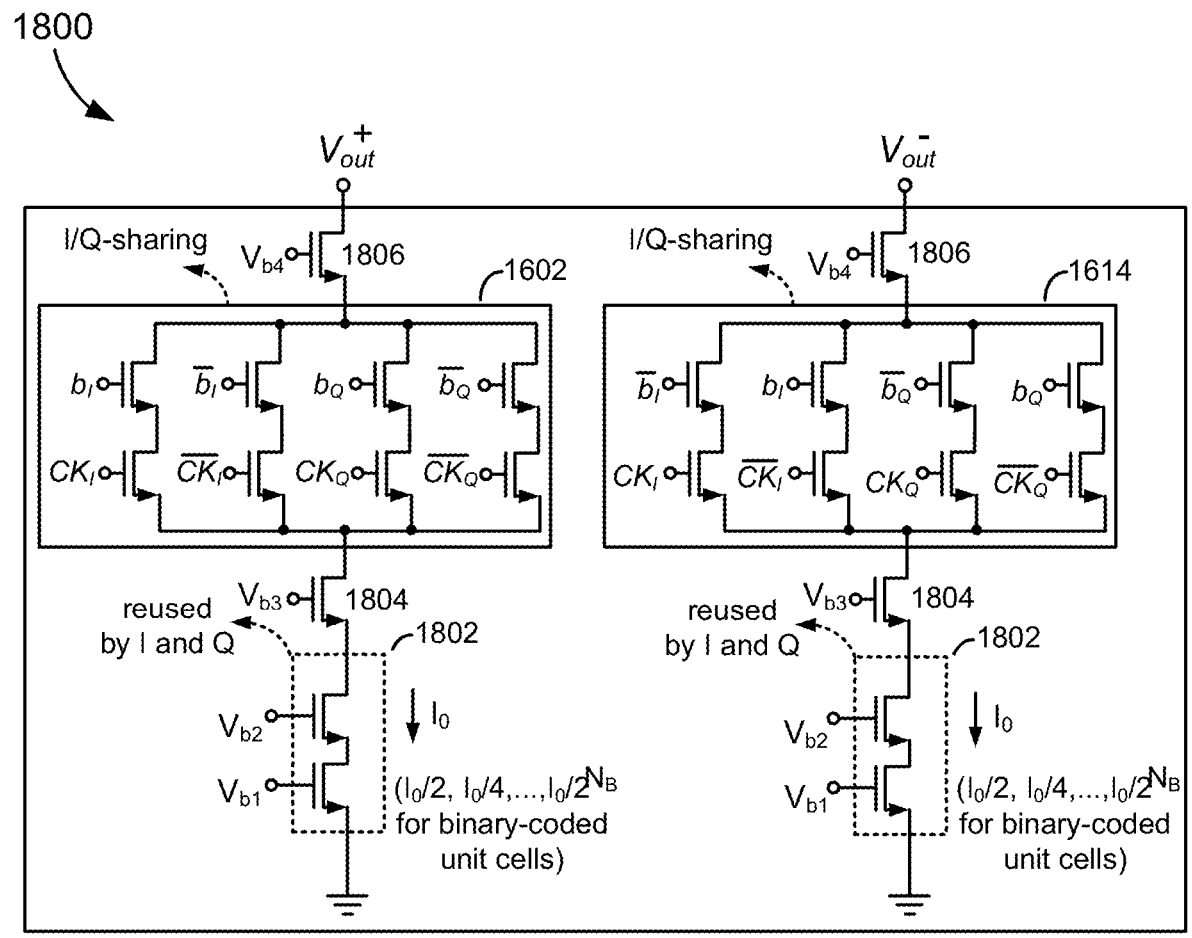
FIG. 18 is a schematic drawing of an interleaving RF-DAC unit cell, in accordance with one embodiment of the invention, that uses current-mode logic to form the XOR/OR combinatorial logic of the interleavers in the interleaving RF-DAC unit cell depicted in FIG. 16.

In one embodiment of the invention the XOR/OR logic of the interleavers 1602 and 1604 is implemented using current-mode logic, by stacking it on top of current sources 1802, as illustrated in the exemplary interleaving DAC unit cell 1800 depicted in FIG. 18. Stacking the XOR/OR current-mode logic on top of the current sources 1802 allows faster switching operation. It also allows the I and Q bits in each complementary IQ-interleaved bit stream to share the same current source (i.e., to "reuse" the current $I_0$), resulting in a smaller unit-cell size and lower power consumption than if sharing was not possible. Transistors 1804 in the interleaving DAC unit cell 1800 serve to shield the switching transistors in the XOR/OR current-mode logic from parasitic capacitances present on the drains of the current sources 1802 and consequently help to achieve and maintain linearity at high frequencies. Thick-oxide cascode transistors 1806 above the current-mode logic interleavers 1602 and 1606 are employed to withstand large voltage swings at the output nodes and to reduce interaction between DAC branches.

Figure 19:
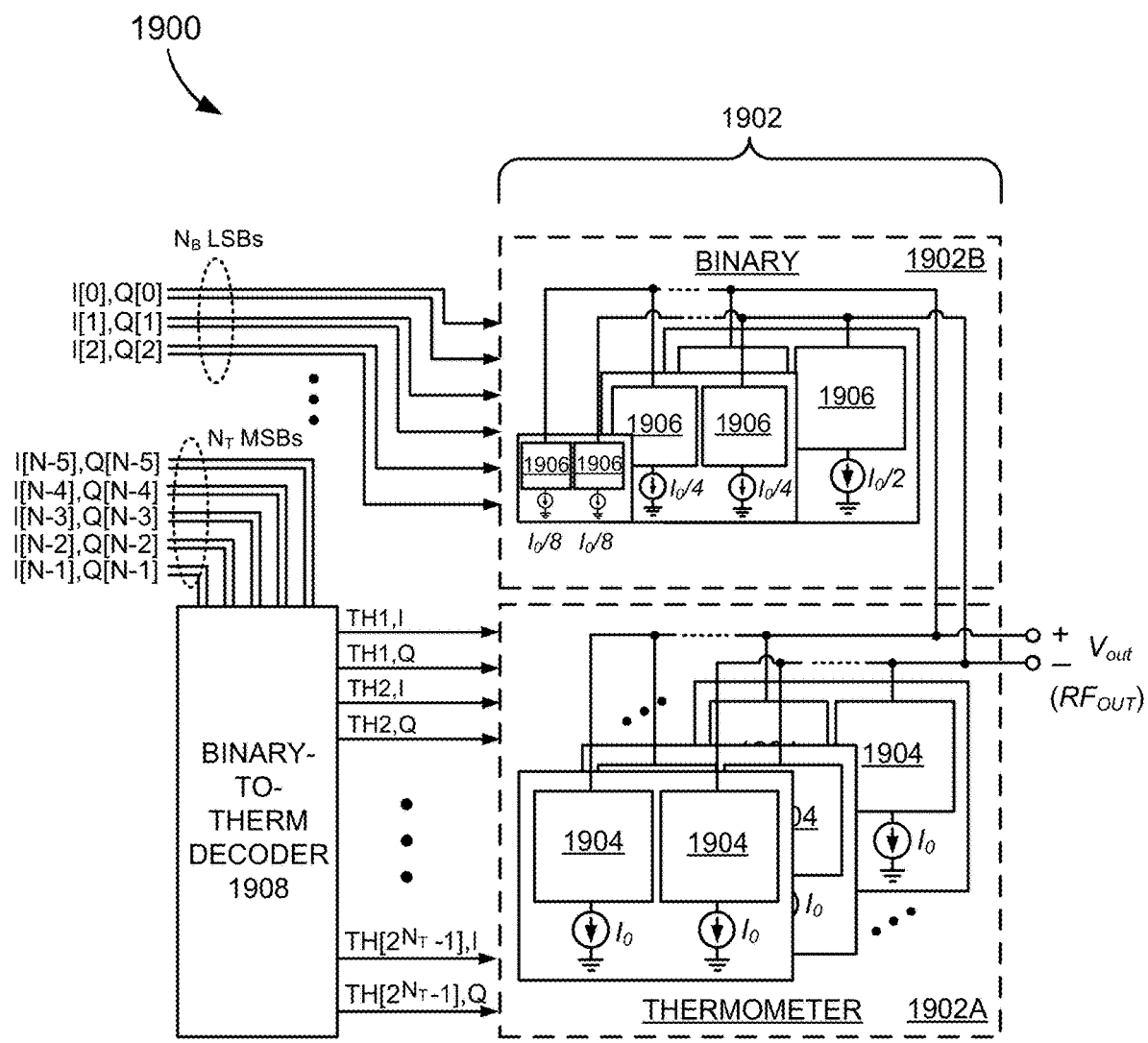
FIG. 19 is an alternative depiction of one of the interleaving RF-DACs of the harmonic rejection RF-DAC depicted in FIG. 7, highlighting how the binary-weighted and unary-weighted mixing RF-DAC unit cells can be formed in an array, along with a binary-to-thermometer encoder.

FIG. 19 is an alternative depiction of one of the interleaving RF-DACs 1408, 1410, and 1412 of the harmonic rejection RF-DAC 1402 depicted in FIG. 14, highlighting how the binary-weighted and unary-weighted mixing RF-DAC unit cells can be formed in an array. The interleaving current steering DAC 1900 comprises an array of interleaving DAC unit cells 1902 that share a common output and collectively operate according to the current-steering principle. In this exemplary embodiment of the invention, and similar to the combined binary-weighted and thermometer-coded current steering DAC 1100 discussed above in reference to FIG. 11, the array of interleaving DAC unit cells 1902 is segmented into a first plurality 1902A of thermometer-coded (unary-weighted) interleaving DAC unit cells 1904 and a second plurality 1902B of binary-weighted interleaving DAC unit cells 1906. The $N_T$ most significant MSBs of the upsampled N-bit digital I and Q digital baseband signals $I_{BB-UP}$ and $Q_{BB-UP}$ (shown as I/Q bit pairs I[0],Q[0], I[1],Q[1], . . . , I[N–1],Q[N–1] in FIG. 19) are converted to thermometer code by a binary-to-thermometer decoder 1908, and the resulting thermometer-coded I and Q signals are used to steer the $2^{N_T}-1$ thermometer-coded interleaving DAC unit cells 1904. The remaining $N_B$ LSBs of the upsampled N-bit digital I and Q digital baseband signals $I_{BB-UP}$ and $Q_{BB-UP}$ require no decoding and consequently directly steer the $N_B$ binary-weighted DAC unit cells 1906.

Figure 20:
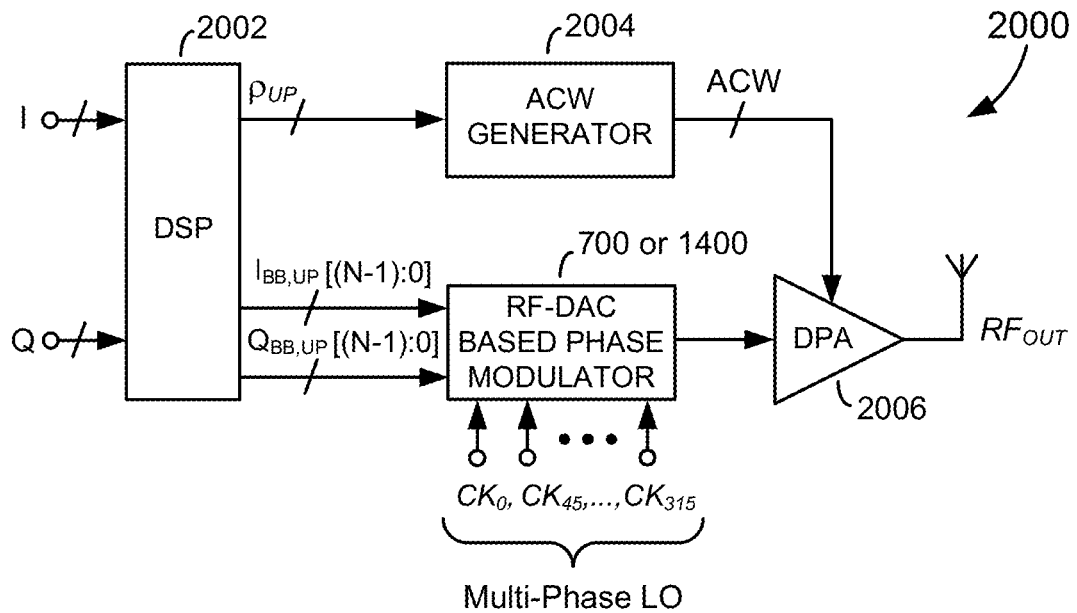
FIG. 20 is a drawing of a polar modulator, according to one embodiment of the present invention.

The RF-DAC based phase modulator of the present invention, which has been described in detail above, may be used in any application or device that requires an RF phase modulator. Because of its low phase error, wide modulation bandwidth capability, and frequency agility, it is particularly well suited for use in polar modulators and RF transmitters that are required to operate in accordance with advanced communications standards such as WiFi, WiMAX, and LTE, for example. FIG. 20 illustrates, for example, how the RF-DAC based phase modulator 700 shown and described above in reference to FIG. 7 or the RF-DAC based phase modulator 1400 shown and described above in reference to FIG. 14 can be employed in a digitally-intensive polar modulator 2000. The digitally-intensive polar modulator 2000 comprises a DSP 2002; an ACW generator 2004; an RF-DAC based phase modulator constructed based on one of the RF-DAC based phase modulators described above (e.g. RF-DAC based phase modulator 700 or 1400); and a DPA 2006. The DSP 2002 is configured to produce an upsampled digital amplitude modulation signal $\rho_{UP}$, which is directed to the input of the ACW generator 2004 and upsampled N-bit digital I and Q digital baseband signals $I_{BB,UP}[(N-1):0]$ and $Q_{BB,UP}[(N-1):0]$, similar to as described above in reference to FIG. 4. (Note that, although the ACW generator 2004 is shown in FIG. 20 as being separate from the DSP 2002, it could be subsumed within, i.e., may alternatively comprise part of, the DSP 2002.) The upsampled N-bit digital I and Q digital baseband signals $I_{BB,UP}[(N-1):0]$ and $Q_{BB,UP}[(N-1):0]$ are directed to the RF-DAC based phase modulator 700 or 1400, which as explained above operates to produce an analog, constant-envelope, phase-modulated RF carrier, which is applied to the RF input port of the DPA 2006. The DPA 2006 comprises a plurality of switch-mode PAs, typically Class D, E, or F switch-mode PAs, that can be connected in parallel and which are individually activated and deactivated depending on the digital ACW, which varies over time depending on the AM contained in the original upsampled digital amplitude modulation signal $\rho_{UP}$. The DPA 2006 comprises a plurality of switch-mode PAs, typically Class D, E, or F switch-mode PAs, that can be connected in parallel and which are activated or deactivated depending on the ACW. (Note that there are various ways in which the DPA 2006 can be constructed. One approach that can be used is described in D. Chowdhury et al., "An Efficient Mixed-Signal 2.4 GHz Polar Power Amplifier in 65-nm CMOS Technology," IEEE J. Solid-State Circuits, vol. 46, pp. 1796-1809, August 2011, which is incorporated herein by reference.) As the analog, constant-envelope, phase-modulated RF carrier passes through the DPA 2006, the ACW produced by the ACW generator 2004 activates and deactivates the various switch-mode PAs in the DPA 208, according to the ACW. In this manner, the AM represented in the original amplitude modulation signal $\rho_{UP}$ is impressed upon the analog, constant-envelope, phase-modulated RF carrier to produce the final desired non-constant envelope output RF waveform $RF_{OUT}$.

Figure 21:
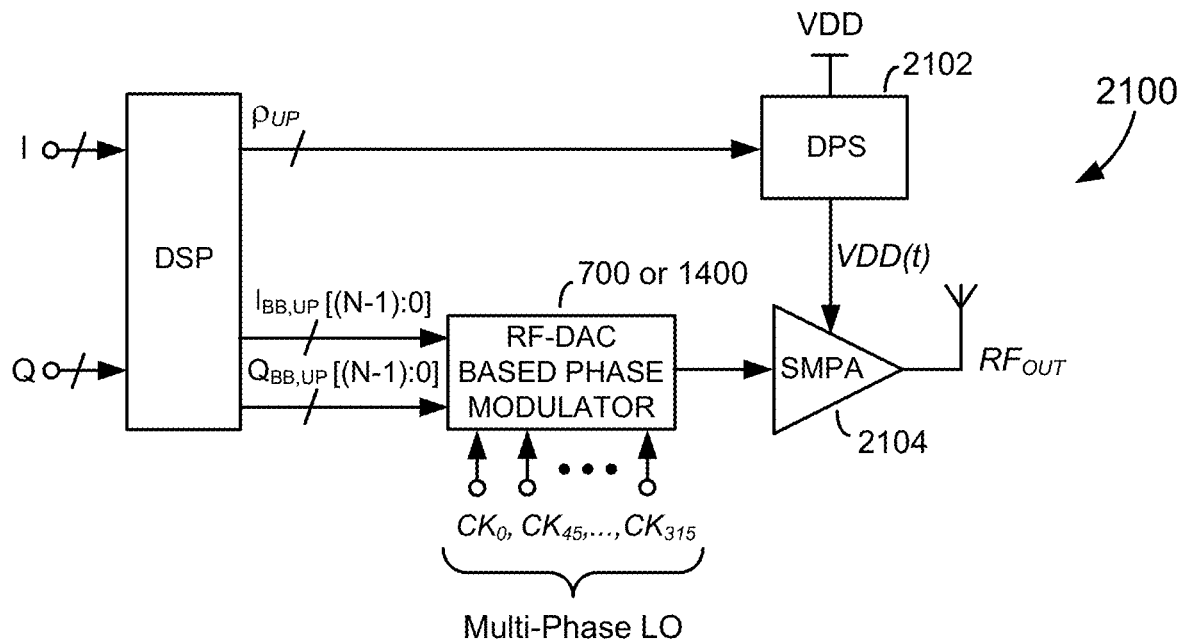
FIG. 21 is a drawing of a polar modulator, according to another embodiment of the present invention.

The RF-DAC based phase modulator of the present invention is also well suited for use in a more conventional polar modulator, such as illustrated in FIG. 21. The polar modulator 2100 is similar to a conventional polar modulator from the standpoint that it employs a dynamic power supply (DPS) 2102 but differs substantially from a conventional polar modulator from the standpoint that it employs the RF-DAC based phase modulator 700 or 1400 described above. The DPS 2102 is configured to produce a DPS voltage $V_{DD}(t)$ that tracks the AM represented in the upsampled digital amplitude modulation signal $\rho_{UP}$. As the SMPA 2104 translates the analog, constant-envelope, phase-modulated RF carrier from the phase modulator 700 or 1400 to higher RF power, the DPS voltage $V_{DD}(t)$ modulates the phase-modulated RF signal's amplitude envelope, via the power supply port of the SMPA 2104, to produce the final desired non-constant envelope output RF waveform $RF_{OUT}$. (Note that the DPA 2006 in the digitally-intensive polar modulator 2000 is also technically an SMPA but is referred to as a DPA in order to emphasize the digital control of it RF output signal envelope using the digital ACW signal.)

Figure 22:
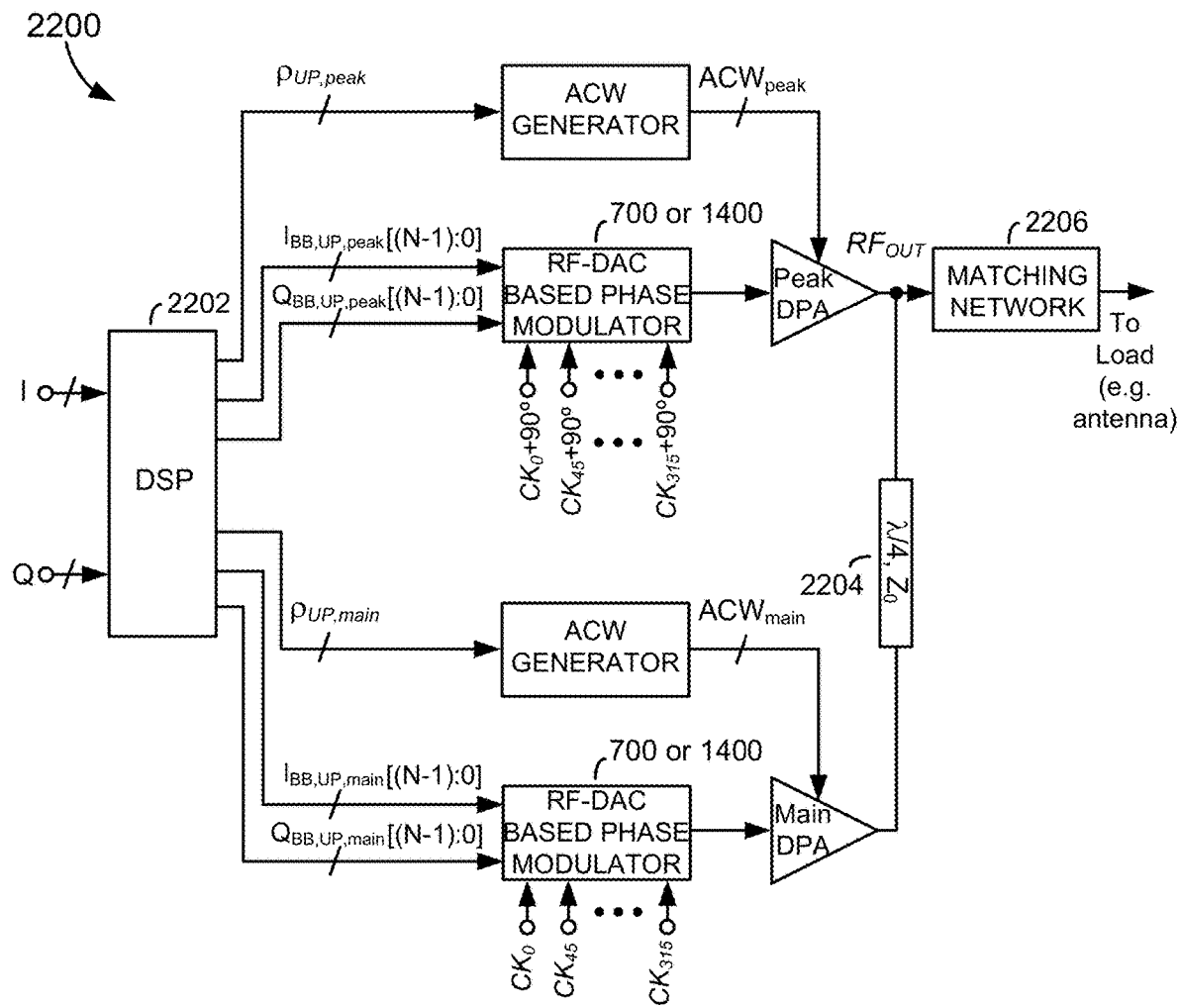
FIG. 22 is a drawing of a polar Doherty PA, according to yet another embodiment of the invention.

The polar modulators 2000 and 2100 described above in reference to FIGS. 20 and 21 are both very efficient since their PAs are switch-mode PAs, which are very efficient at converting DC power to RF power. This high energy efficiency attribute can be further exploited by employing either polar modulator 2000 or 2100 in a Doherty configuration. FIG. 22 illustrates, for example, how two polar modulators, each constructed according to the digitally-intensive polar modulator 2000 depicted in FIG. 20, can be used to perform the peak and main PA functions in what may be referred to as a "polar Doherty PA 2200." In the conventional Doherty PA, the peak (or "peaking") and main PAs are configured to operate as Class-B PAs and a technique known as "load pulling" is used to enhance the efficiency of the Doherty PA when operating at backed off power levels. This load pulling technique, which is achieved by inserting a quarter-wavelength ($\lambda/4$) transmission line (or what is referred to as an "impedance inverter") between the output of the main PA and the output of the peaking PA, allows the Doherty PA to achieve a maximum conversion efficiency of $\eta=\pi/4$ at both a back-off power of −6 dB and at peak envelope power (PEP), and a high conversion efficiency in between, thus making it significantly more efficient than a standalone Class-B PA over the same backed-off output power range. While a maximum conversion efficiency of $\eta=\pi/4$ is high, switch-mode PAs have even higher conversion efficiencies, even approaching 100%. Accordingly, by replacing the conventional main and peaking Class-B PAs with two polar modulators like that depicted in FIG. 20 (or FIG. 21), not only is the conversion efficiency increased above that which can be realized in the conventional Doherty PA, all of the other advantages offered by the RF-DAC based phase modulator 300 or 700 are also gained. It should be mentioned that another difference between the polar Doherty PA 2200 and the conventional Doherty PA is that no additional $\lambda/4$ impedance inverters are needed, other than the $\lambda/4$ impedance inverter 2204 connected between the output of the main DPA and the output of the peak PA. In the conventional Doherty PA, a second $\lambda/4$ impedance inverter must be connected at the input of the peaking PA to account for the 90° phase shift caused by the first $\lambda/4$ impedance inverter in the main PA path, and an output $\lambda/4$ impedance transformer must be inserted between the RF output of the Doherty PA and the load. In contrast, in the polar Doherty PA 2200, phase shift accounting for the one and only $\lambda/4$ impedance inverter 2204 is performed digitally within the DSP 2202, and the output $\lambda/4$ impedance transformation needed between the RF output of the polar Doherty PA 2200 and the load is instead handled by an output matching network 2206.

While various embodiments of the present invention have been presented, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments of the invention but, instead, should be determined by the appended claims, including the full scope of equivalents to which such claims are entitled.

What is claimed is:

1. A radio frequency (RF) phase modulator, comprising:
a first RF digital-to-analog converter (RF-DAC) having a first pair of in-phase (I) and quadrature (Q) inputs configured to receive an I/Q digital baseband signal pair formatted according to a predetermined digital modulation scheme, a first plurality of local oscillator (LO) clock inputs configured to receive a first plurality of LO clock signals, and an RF output;
a second RF-DAC having a second pair of I and Q inputs configured to receive the I/Q digital baseband signal pair, a second plurality of LO clock inputs configured to receive a second plurality of LO clock signals of different phases relative to the first plurality of LO clock signals, and an RF output coupled to the RF output of the first RF-DAC; and
a third RF-DAC having a third pair of I and Q inputs configured to receive the I/Q digital baseband signal pair, a third plurality of LO clock inputs configured to receive a third plurality of LO clock signals of different phases relative to the second plurality of LO clock signals, and an RF output coupled to the RF outputs of the first and second RF-DACs.

2. The RF phase modulator of claim 1, wherein the second plurality of LO clock signals is phase shifted forty-five degrees with respect to the first plurality of LO clock signals and the third plurality of LO clock signals is phase shifted forty-five degrees with respect to the second plurality of LO clock signals.

3. The RF phase modulator of claim 1, wherein each of the first, second, and third RF-DACs comprises an I-path RF-DAC and a Q-path RF-DAC.

4. The RF phase modulator of claim 3, wherein the I-path RF-DAC comprises an I-path current steering DAC and the Q-path RF-DAC comprises a Q-path current steering DAC.

5. The RF phase modulator of claim 4, wherein the I-path current steering DAC is an I-path current steering RF-DAC, the Q-path current steering DAC is a Q-path current steering RF-DAC, and the I-path and Q-path current steering RF-DACs each includes a plurality of RF-DAC unit cells.

6. The RF phase modulator of claim 5, wherein each RF-DAC unit cell comprises mixing logic that upconverts an associated input digital bit stream to an LO frequency, a current source, and one or more switches that connect and disconnect the current source to and from a load in response to an upconverted bit stream produced by the mixing logic.

7. The RF phase modulator of claim 1, wherein each of the first, second, and third RF-DACs comprises an I-Q interleaving DAC.

8. The RF phase modulator of claim 7, wherein each I-Q interleaving DAC comprises a current steering DAC including a plurality of DAC unit cells.

9. The RF phase modulator of claim 8, wherein each I-Q interleaving DAC is an I-Q interleaving RF-DAC, each I-Q interleaving RF-DAC comprises a current steering RF-DAC, and each current steering RF-DAC comprises a plurality of RF-DAC unit cells.

10. The RF phase modulator of claim 9, wherein each RF-DAC unit cell comprises mixing logic that upconverts an input digital bit stream to an LO frequency, a current source, and one or more switches that connect and disconnect the current source to and from a load in response to an upconverted bit stream produced by the mixing logic.

11. The RF phase modulator of claim 1, further comprising a low-pass filter (LPF) coupled to the RF outputs of the first, second, and third RF-DACs.

12. The RF phase modulator of claim 11, further comprising a limiter coupled to an output of the LPF.

13. A harmonic rejection phase modulation method, comprising:
receiving an input in-phase (I)/quadrature (Q) digital baseband signal pair formatted according to a predetermined digital modulation scheme;
upconverting the input I/Q digital baseband signal pair to an LO frequency in accordance with a first set of LO clocks to produce a first upconverted I/Q digital signal;
converting the first upconverted I/Q signal to a first upconverted analog signal;
upconverting the input I/Q digital baseband signal pair to a LO frequency in accordance with a second set of LO clocks that is shifted in phase with respect to the first set of LO clocks to produce a second upconverted I/Q digital signal;
converting the second upconverted I/Q signal to a second upconverted analog signal;
upconverting the input I/Q digital baseband signal pair to a LO frequency in accordance with a third set of LO clocks that is shifted in phase with respect to the second set of LO clocks to produce a third upconverted I/Q digital signal;
converting the third upconverted I/Q signal to a third upconverted analog signal; and
combining the first, second, and third upconverted analog signals to produce a combined upconverted analog signal, said combining including constructively combining a fundamental LO component and destructively combining $3^{rd}$-order and $5^{th}$-order LO harmonics.

14. The method of claim 13, wherein the second set of LO clocks is phase shifted forty-five degrees with respect to the first set of LO clocks and the second set of LO clocks is phase shifted forty-five degrees with respect to the second set of LO clocks.

15. The method of claim 13, wherein:
upconverting the input I/Q digital baseband signal pair to the first upconverted I/Q digital signal and converting the first upconverted I/Q signal to the first upconverted analog signal is performed by a first radio frequency digital-to-analog converter (first RF-DAC);
upconverting the input I/Q digital baseband signal pair to the second upconverted I/Q digital signal and converting the second upconverted I/Q signal to the second upconverted analog signal is performed by a second radio frequency digital-to-analog converter (second RF-DAC); and
upconverting the input I/Q digital baseband signal pair to the third upconverted I/Q digital signal and converting the third upconverted I/Q signal to the third upconverted analog signal is performed by a third radio frequency digital-to-analog converter (third RF-DAC).

16. The method of claim 15, wherein the first, second, and third RF-DACs each comprises an I-path RF-DAC and Q-path RF-DAC.

17. The method of claim 16, wherein each I-path RF-DAC comprises an I-path current steering DAC and each Q-path RF-DAC comprises a Q-path current steering DAC.

18. The method of claim 17, wherein each of the I-path current steering DACs is an I-path current steering RF-DAC having a first plurality of RF-DAC unit cells and each of the Q-path current steering DACs is a Q-path current steering RF-DAC having a second plurality of RF-DAC unit cells.

19. The method of claim 18, wherein each of the RF-DACs in both the first an second pluralities of RF-DAC unit cells comprises mixing logic that upconverts an associated digital bit stream to the LO frequency, a current source, and one or more switches that connect and disconnect the current source to and from a load in response to an upconverted bit stream produced by the mixing logic.

20. The method of claim 15, wherein the first, second, and third upconverted I/Q digital signals are first, second, and third I-Q interleaved signals and each of the first, second, and third RF-DACs comprises an I-Q interleaving RF-DAC.

21. The method of claim 20, wherein each of the I-Q interleaving RF-DACs comprises a current steering DAC.

22. The method of claim 21, wherein each of the current steering DACs is a current steering RF-DAC having a plurality of RF-DAC units cells.

23. The method of claim 22, wherein each RF-DAC unit cell comprises mixing logic that upconverts an associated digital bit stream to the LO frequency, a current source, and one or more switches that connect and disconnect the current source to and from a load in response to an upconverted bit stream produced by the mixing logic.

* * * * *